United States Patent

Howlett

[15] 3,688,250

[45] Aug. 29, 1972

[54] AMPLIFIER SYSTEM

[72] Inventor: Donald L. Howlett, Houston, Tex.

[73] Assignee: Texaco Inc., New York, N.Y.

[22] Filed: Sept. 4, 1969

[21] Appl. No.: 855,172

[52] U.S. Cl. .....340/15.5 DP, 340/15.5 GC, 330/200

[51] Int. Cl. ..................................323 22, G01v 1/22

[58] Field of Search ...............340/15.5 GC, 15.5 DP; 181/15 OS; 330/22, 200; 323/22

[56] References Cited

UNITED STATES PATENTS

| | | | |
|---|---|---|---|
| 3,241,100 | 3/1966 | Loofbourrow | 340/15.5 |
| 3,252,105 | 5/1966 | Patchell | 330/200 |
| 3,264,574 | 8/1966 | Loofbourrow | 330/51 |
| 3,426,285 | 2/1969 | Uhrig | 330/51 |
| 3,470,457 | 9/1969 | Howlett | 323/22 |

*Primary Examiner*—Benjamin A. Borchelt
*Assistant Examiner*—N. Moskowitz
*Attorney*—K. E. Kavanagh, Thomas H. Whaley and Robert J. Sanders, Jr.

[57] ABSTRACT

A wide dynamic range automatic high speed digital gain ranging amplifier system having a plurality of amplifier stages coupled in cascade circuit relationship, wherein improved bandwidth is provided by DC coupling between the successive cascaded stages and a filter in a feedback path from the output of the last cascaded stage to the input of the first cascaded stage together with selectively timed chopper switching means for alternately interrupting the input signal to the cascaded stages and the feedback path in substantially mutually out of phase relationship. The respective outputs of the amplifier stages are coupled through a common output circuit to a comparator circuit for comparison with a predetermined reference signal. Sequencing means are provided for momentarily closing switch means in timed sequence for sequentially coupling the respective outputs of the successive amplifier stages to the comparator circuit during successive, relatively brief sampling time intervals. Means are provided for selectively maintaining one of the switch means in its closed position for a holding time interval of longer duration than the sampling time interval when an output signal coupled through said switch means to the common output circuit during one of the sampling intervals bears a predetermined relationship of the reference signal. In a preferred embodiment of the amplifier system, the common output circuit is coupled to an analog-to-digital converter and thence to digital recording means for recording signals corresponding to both the instantaneous digital value of the signal at the common output circuit and the gain level to which the signal is amplified, as determined by the one of said switch means selectively maintained closed to pass the signal to the analog-to-digital converter.

86 Claims, 23 Drawing Figures

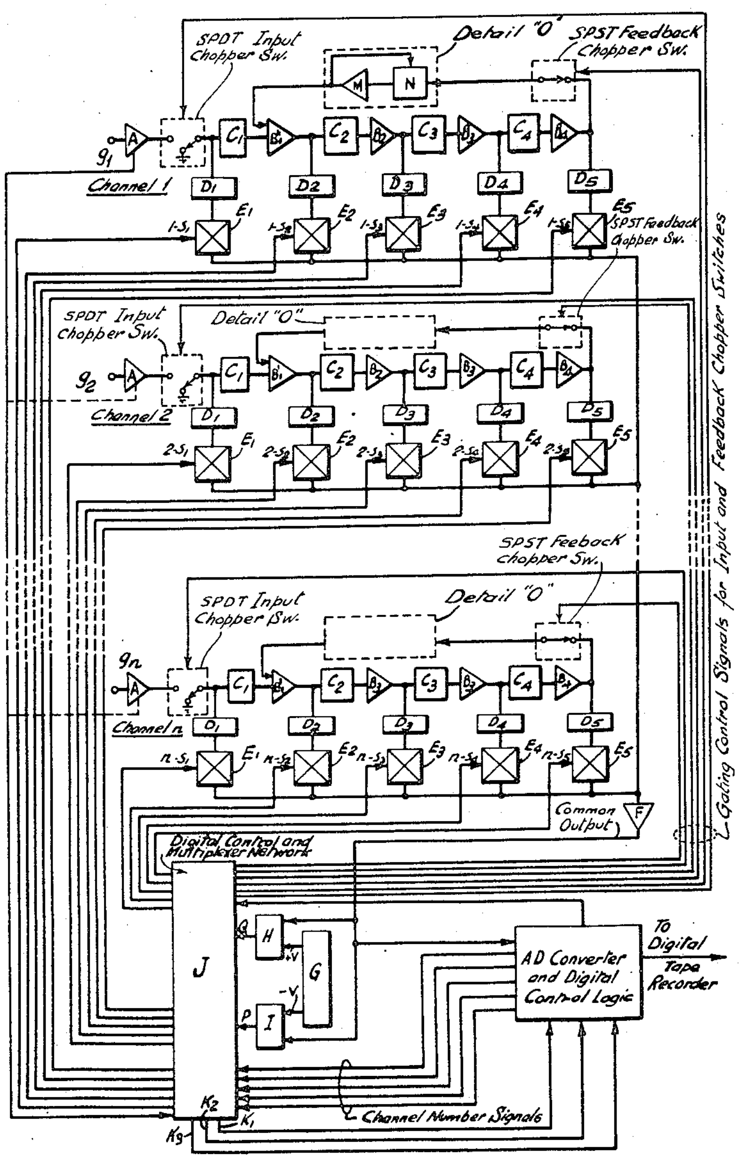
SPDT Input Chopper Sw.
Detail "O"
SPST Feedback Chopper Sw.
Channel 1
Channel 2
Channel n
Common Output
Digital Control and Multiplexer Network
J
H
G
I
AD Converter and Digital Control Logic
To Digital Tape Recorder
Channel Number Signals
Gating Control Signals for Input and Feedback Chopper Switches Patented Aug. 29, 1972 3,688,250

12 Sheets-Sheet 12

AMPLIFIER SYSTEM

The present invention relates generally to amplifier networks featuring broad bandwidth characteristics and which are suitable for wide dynamic range amplifier systems; and, more particularly, to automatic high speed gain ranging amplifier systems capable of handling wide dynamic range signals, such as those encountered in seismic data processing and, therefore, is particularly suitable for use in digital seismic recording systems.

The development of wide dynamic range digital seismic field recording instruments, having the ability to record seismic data in digital form on high speed magnetic tapes, has brought about the need for precise gain, low distortion analog amplifiers. Such amplifiers are required between the geophones and the analog-to-digital converters of such systems in order to faithfully reproduce the seismic signals at an amplitude level acceptable to the analog-to-digital converter. This makes it possible to realize the full dynamic measuring range of the system. Advantageously, such systems should have broad bandwidth characteristics.

Since seismic signals may conventionally have a wide dynamic range, say of the order of 120 db, it has often been the practice in the past to compress such signals, typically to 78 db, so that they can be processed by the analog-to-digital converter and recorded. Various gain control devices have been utilized to accomplish such compression, for example, programmed gain control wherein the gain is slowly changed between preset limits as the average seismic signal amplitude changes. Another example of a typical automatic gain control system involves time averaging of the amplified seismic energy to adjust the gain. More recently, amplifiers have been developed which provide step gain changes based on some aspect of signal amplitude existing in a time window of the seismic record. One type of amplifier system providing step gain changes is commonly known as the binary gain amplifier, for example, such as those shown in U.S. Pat. No. 3,308,392—McCarter and U.S. Pat. No. 3,315,233—Hibbard et al. Amplifier systems utilizing step gain changes are also shown in U.S. Pat. No. 2,967,292—Eisner, No. 3,241,100—Loofbourrow and No. 3,264,574—Loofbourrow.

The present invention is directed principally to improvements in the bandwidth characteristics of cascaded amplifier network, and is particularly directed to such improvements for step gain control amplifier systems capable of handling a wide dynamic range of signals and providing automatic gain ranging, such as those disclosed in an application for United States Letters Patent for "Amplifier System," Ser. No. 786,569 filed Dec. 24, 1968 and issued Feb. 9, 1971, as U.S. Pat. No. 3,562,744 in the name of Donald L. Howlett. One of the principal objects of the present invention is to provide such a wide dynamic range automatic high speed digital gain ranging amplifier system which automatically sets the optimum gain with precision based upon the instantaneous amplitude of the input at the time the analog-to-digital conversion is initiated, and which features improved bandwidth characteristics with substantially uniform gain over a relatively wide frequency range including DC.

SUMMARY OF THE INVENTION

Briefly stated, one aspect of the present invention involves the provision of a cascaded amplifier network of the type wherein various output paths at different gain levels are provided at selected stages of the network and wherein means are provided for extending the bandwidth of the network comprising the provision of DC coupling between the successive cascaded stages and a feedback path from the output of the last cascaded stage to the input of the first cascaded stage together with selectively timed chopper switching means for alternately interrupting the input signal of the cascaded stages and the feedback path in substantially mutually out of phase relationship. The invention is particularly suited to provide a wide dynamic range automatic high speed gain ranging amplifier system comprising a cascaded amplifier network including a plurality of DC coupled amplifier stages provided with a feedback path from the output of the last cascaded stage to the input of the first cascaded stage and means for deriving outputs from successive stages of the network for establishing a plurality of progressively different predetermined amplifier gain ranges for said network. Advantageously the feedback path includes a filter having a high frequency roll-off characteristic and a gain of at least unity. Means are provided for sequentially switching from one to another of said gain ranges during successive sampling intervals while signals are being translated through said network to a common output and which includes means for comparing signals translated to said common output with a predetermined reference signal and for selectively maintaining a predetermined one of said gain ranges during a holding time interval significantly longer than said sampling intervals when the output signal translated to the common output bears a predetermined relationship to said reference signal.

The selectively timed chopper switching means for alternately interrupting the input signal and feedback path are synchronized with the gain range switching means so that the signal sampling and holding time intervals occur when the input signal is being connected to the cascaded stages.

In a preferred embodiment, the means for establishing said progressively different gain ranges comprises means for selectively switching the respective outputs of said cascaded stages to the common output circuit during the sampling intervals and the means for selectively maintaining one of said gain ranges comprises means for selectively maintaining one of said cascaded stage outputs coupled to said common output during the holding time interval.

Advantageously, in accordance with a preferred aspect of the invention, the common output circuit is coupled through an analog-to-digital converter to a digital recording means for recording signal information corresponding to the instantaneous digital value of the signal at the common output circuit and the gain level at which the signal is being translated through the system, as determined by which one of the amplifier gain ranges is being maintained during the holding interval while the signal is being coupled to the common output circuit.

In accordance with a further aspect of the invention a plurality of said gain ranging amplifier systems are provided, together with multiplexing means for coupling the respective outputs thereof on a time shared basis to means comprising the analog-to-digital converter.

In a preferred embodiment the wide dynamic range amplifier system comprises part of a seismic data processing system including means for supplying seismic signal information to the input of the amplifier system.

In a preferred embodiment the feedback signal and incoming signal are applied to a stage of amplification having an amplification factor of 2, with appropriate networks providing attenuation of the respective signals of 1/2, so that the stage has a net gain of unity.

Advantageously, the feedback network includes an active filter having a gain of at least unity and a high frequency roll-off characteristic.

The objects and advantages of this invention may be better understood and appreciated by referring to the detailed description set forth below, together with the drawings in which:

FIG. 1*a* is a schematic circuit diagram, partly in block form, showing a seismic data processing system incorporating a plurality of wide dynamic range automatic high speed gain ranging amplifier systems, in accordance with the present invention.

FIG. 1*b* is a schematic circuit diagram, partly in block form, illustrating another embodiment of the present invention incorporated in a seismic data processing system like that of FIG. 1*a*.

FIG. 1*c* is a schematic circuit diagram, partly in block form, illustrating in further detail a portion of the systems shown in FIGS. 1*a* and 1*b*, especially that portion of the respective systems identified as element J in FIGS. 1*a* and 1*b*.

FIG. 2*a* is a schematic circuit diagram, partly in block form, illustrating another form of a seismic data processing system incorporating a plurality of wide dynamic range high speed amplifier systems in accordance with the present invention.

FIG. 2*b* is a schematic circuit diagram, partly in block form, illustrating another embodiment of the invention incorporated in a seismic data processing system like that of FIG. 2*a*.

FIG. 2*c* is a schematic circuit diagram, partly in block form, illustrating in further detail a portion of the systems shown in FIGS. 2*a* and 2*b*, especially that portion of the respective systems identified as element J' in FIGS. 2*a* and 2*b*.

Figure 4A:
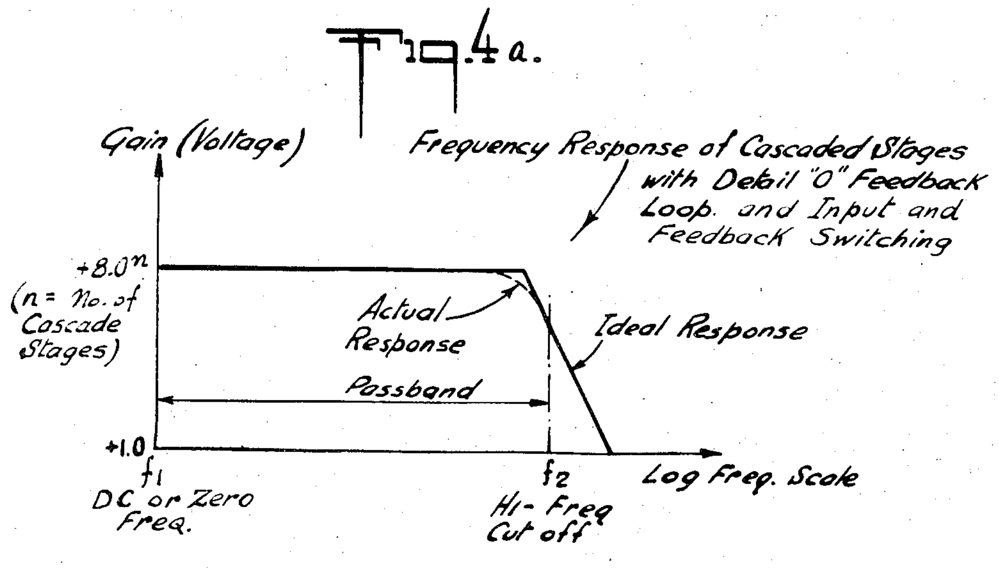

FIG. 4*a* is a diagrammatical representation showing the characteristic frequency response of the cascaded circuit networks shown in FIGS. 1*a*, 1*b*, 2*a* and 2*c*, including the Detail "O" feedback loop of the respective cascaded network together with the input and feedback switching means.

Figure 5:
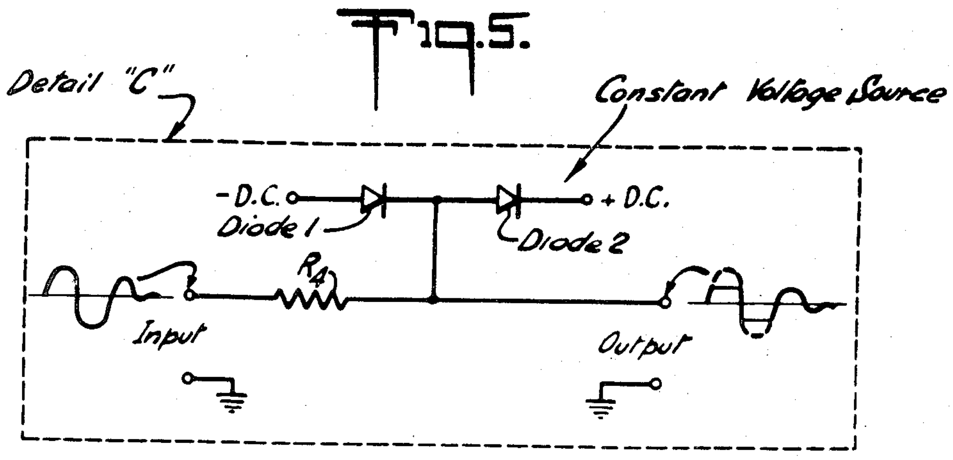

FIG. 5 is a schematic circuit diagram illustrating in further detail that portion of the systems of FIGS. 1*a*, 1*b*, 2*a* and 2*b* identified as Detail "C."

Figure 6:
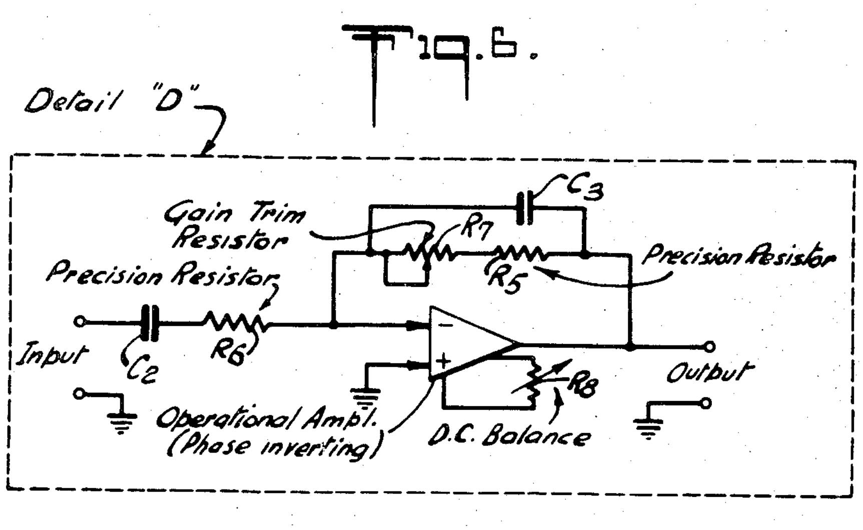

FIG. 6 is a schematic circuit diagram, partly in block form, illustrating in further detail that portion of the systems shown in FIGS. 1*a*, 1*b*, 2*a* and 2*b* identified as Detail "D."

Figure 6A:
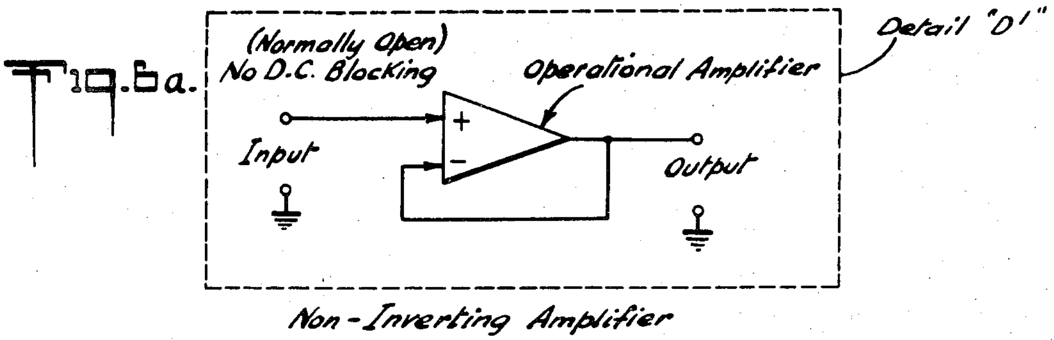

FIG. 6*a* is a schematic circuit diagram, partly in block form, illustrating an alternate and preferred form of the portion of the systems shown in 1*a*, 1*b*, 2*a* and 2*b* identified as Detail "D" and which alternative form is identified in FIG. 6 as Detail "D'."

Figure 7:
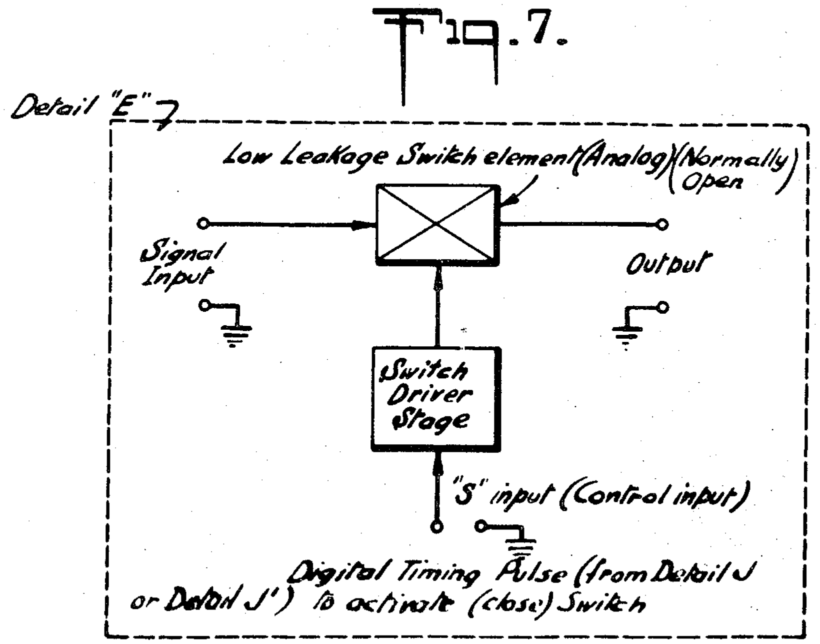

FIG. 7 is a schematic circuit diagram, in block form, illustrating in further detail that portion of the systems shown in FIGS. 1*a*, 1*b*, 2*a* and 2*b* identified as Detail "E."

Figure 8:
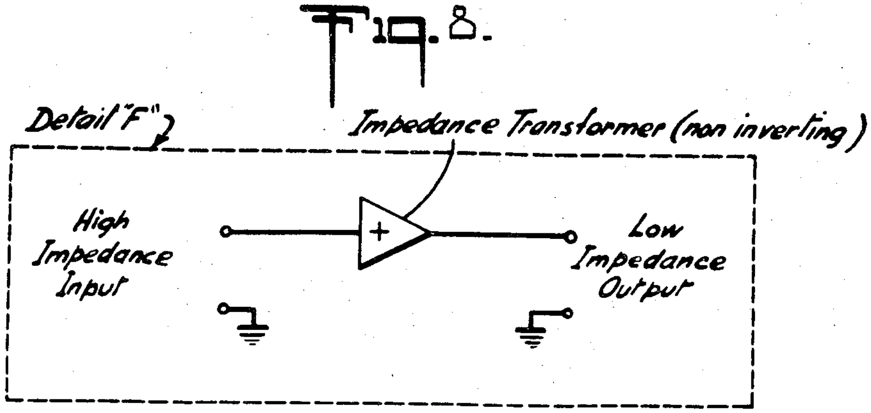

FIG. 8 is a schematic circuit diagram, in block form, illustrating in further detail that portion of the systems shown in FIGS. 1*a*, 1*b*, 1*c*, 2*a*, 2*b* and 2*c* identified as Detail "F."

Figure 9:
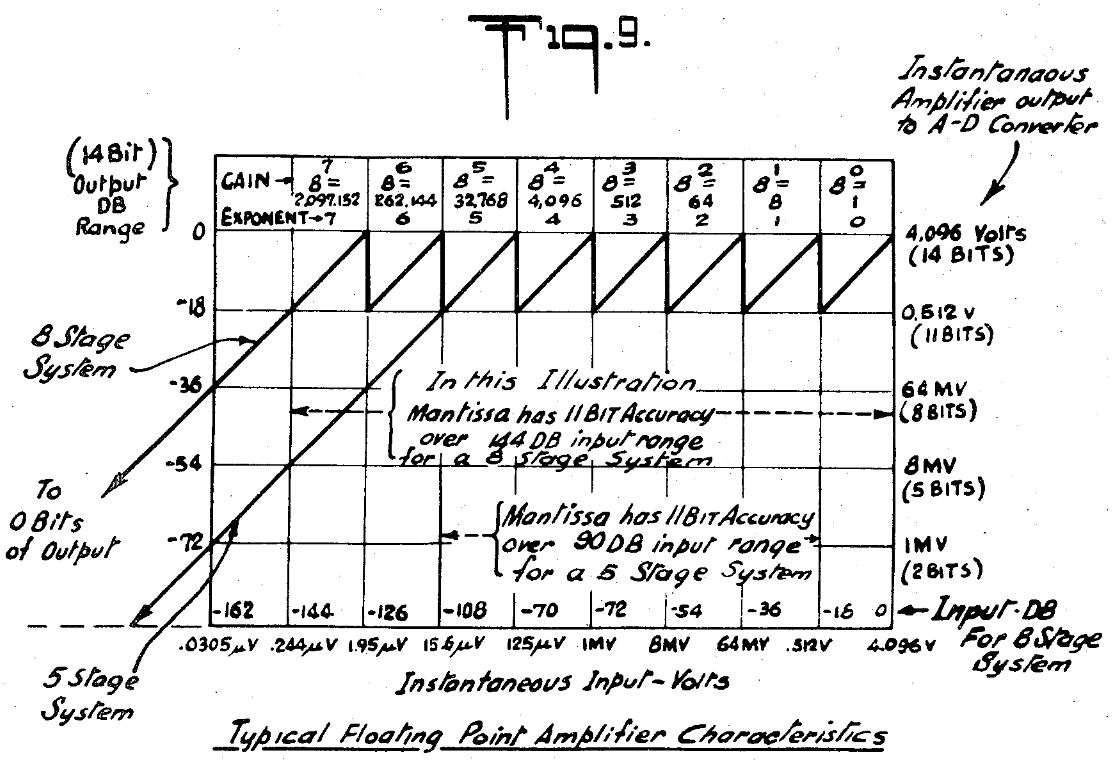

FIG. 9 is a diagrammatical representation of the amplitude of a signal after amplification, illustrating the characteristics of the one example of an amplifier system constructed in accordance with the principles of the present invention.

Figure 1A:
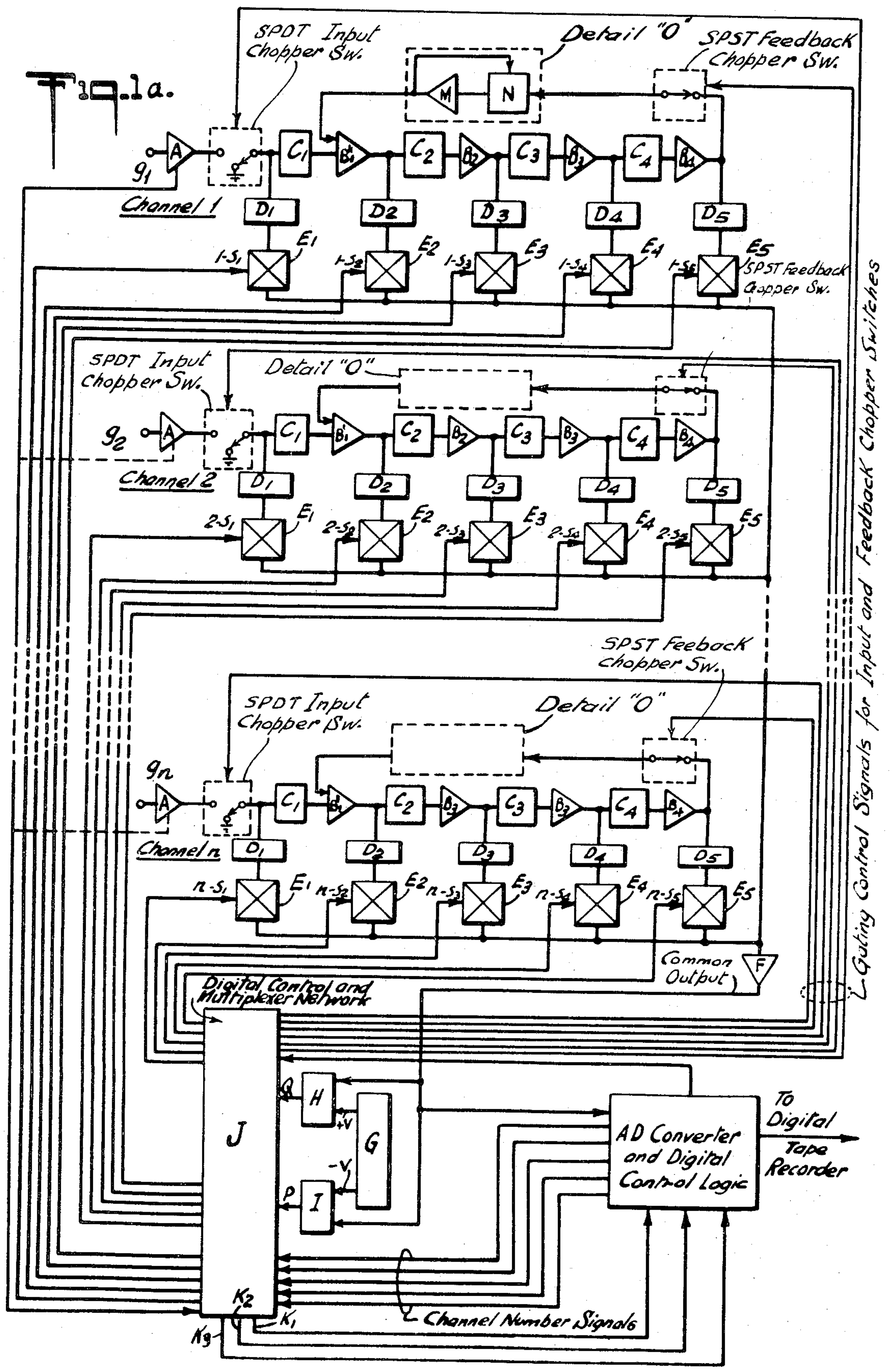
Figure 1B:
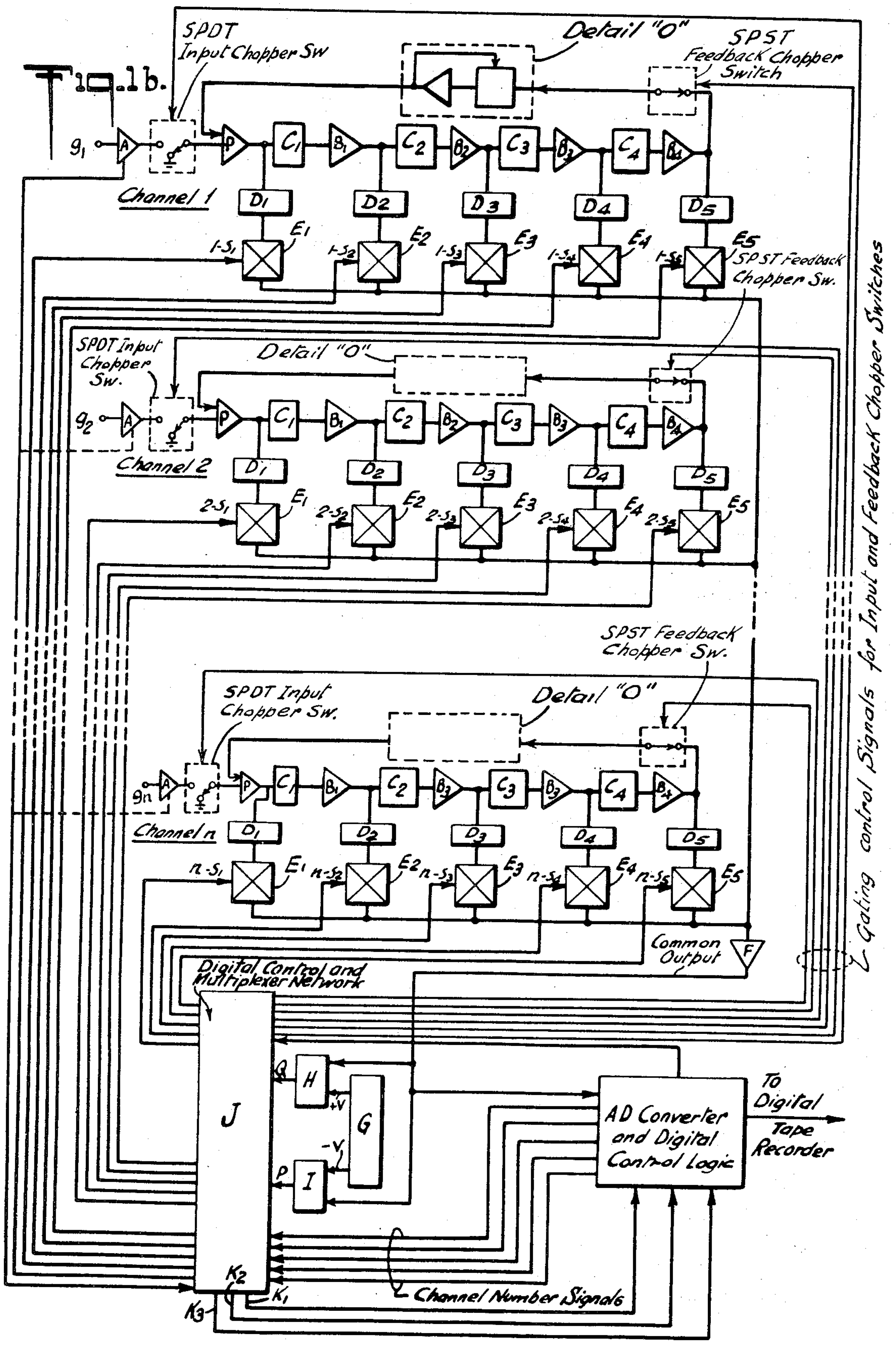
Figure 2A:
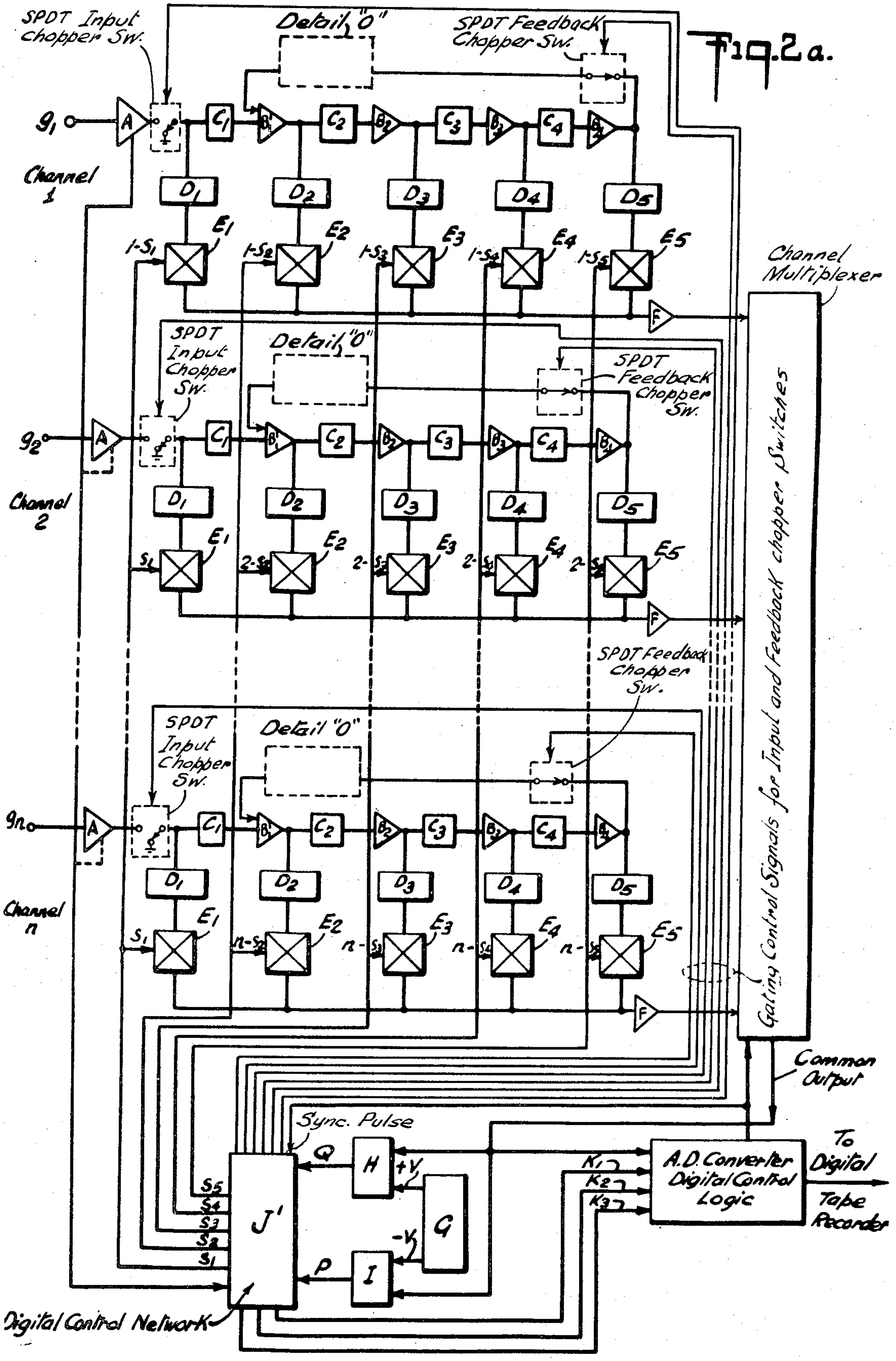
Figures 10, 11:
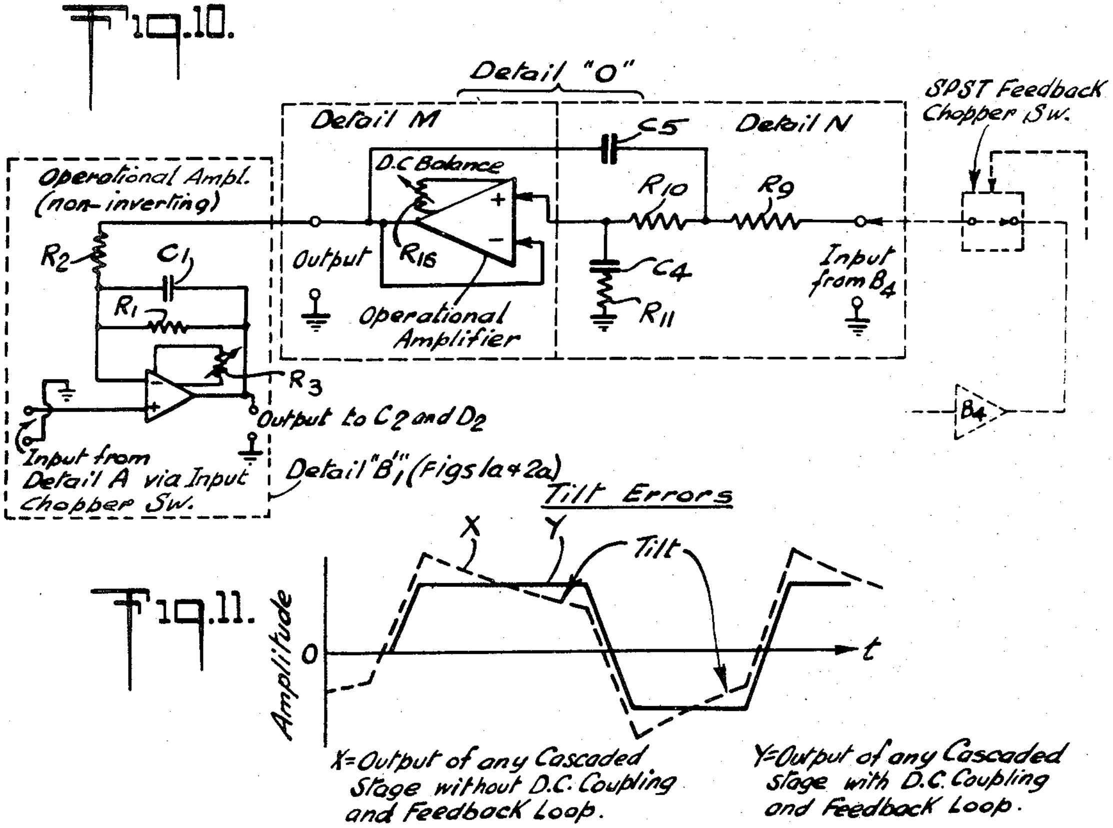

FIG. 10 is a schematic circuit diagram, partly in block form, illustrating in further detail those portions of the systems shown in FIGS. 1*a*, 1*b*, 2*a* and 2*b* identified as Detail "0" (comprising Detail "M" and Detail "N") and that portion of the systems shown in FIGS. 1*a* and 2*a* as Detail "$B_1$'."

FIG. 11 is a diagrammatical representation showing in dashed line a plot of possible tilt errors which may occur at the output of any given cascaded stage of the amplifier network illustrated in FIGS. 1*a* through 2*c*, when not provided with DC coupling and a feedback path in accordance with the present invention, and sowing the corresponding output in solid line provided in accordance with the present invention.

Figure 12:
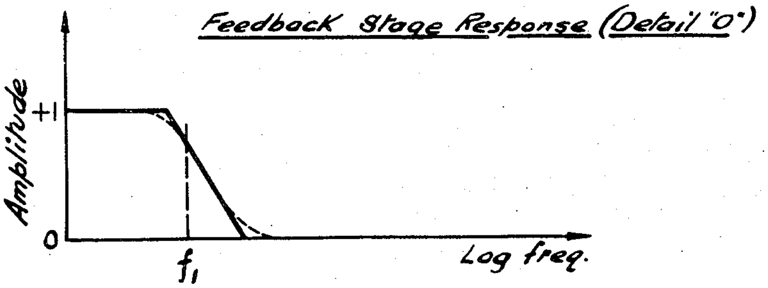

FIG. 12 is a diagrammatical representation showing the characteristic response of the amplifier network feedback stage, identified as Detail "O," provided as a part of the illustrated embodiment of the present invention.

Figure 2B:
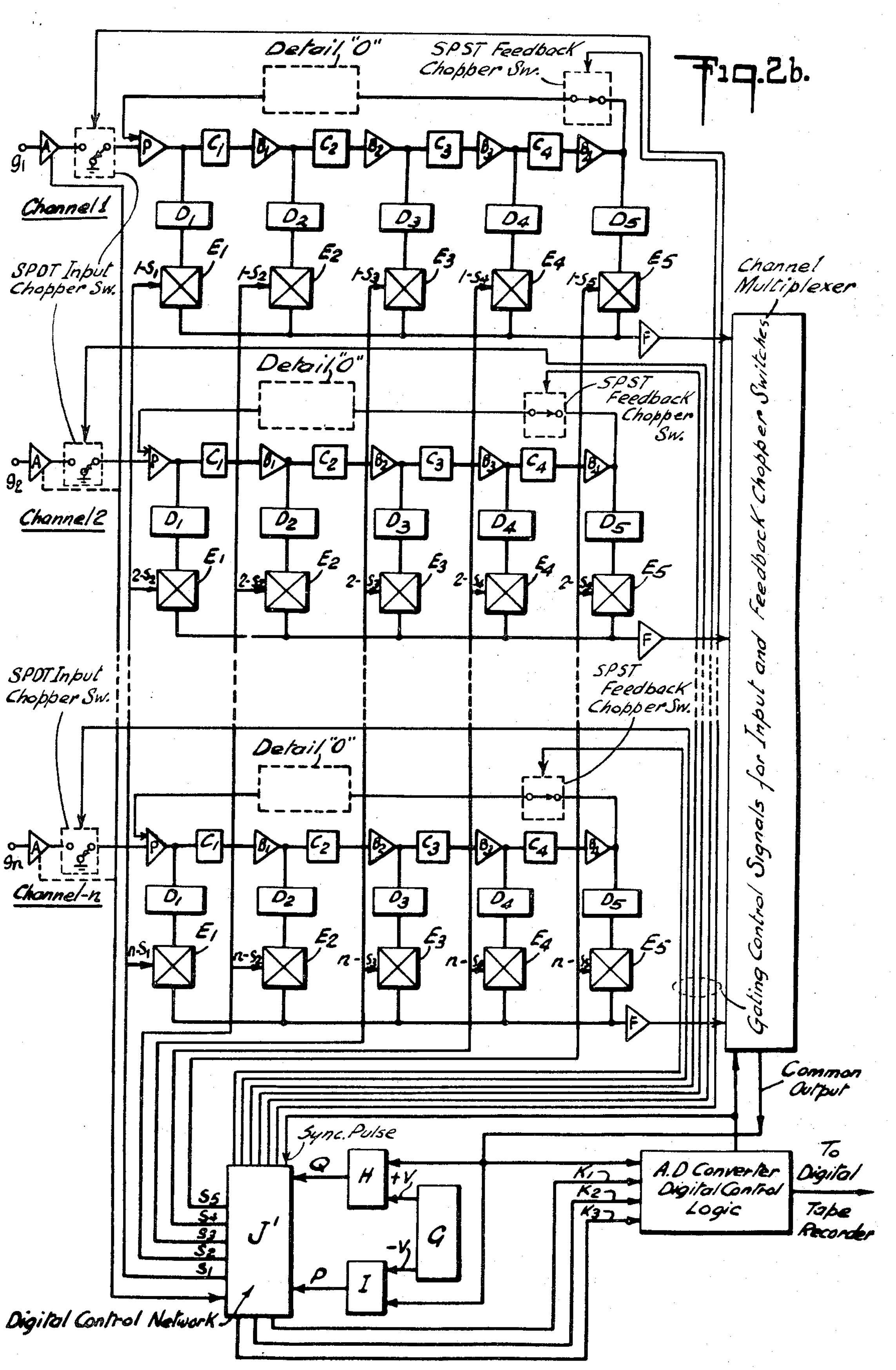
Figure 13:
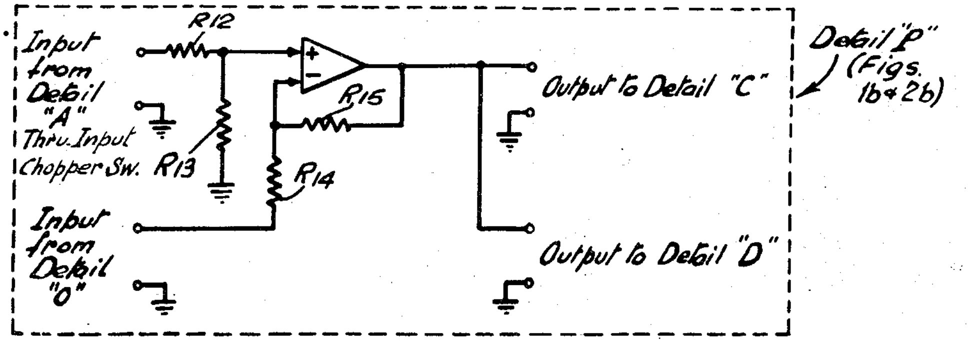

FIG. 13 is a schematic circuit diagram, partly in block form, illustrating in further detail that portion of the systems shown in FIGS. 1*b* and 2*b* identified as Detail "P."

Figure 14:
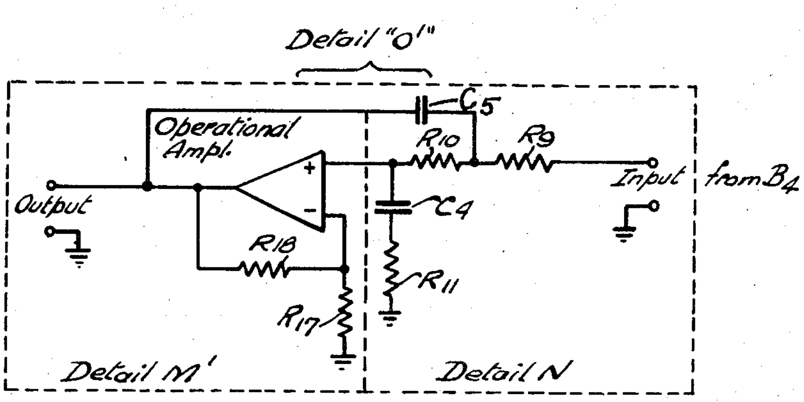

FIG. 14 is a schematic circuit diagram, partly in block form, illustrating an alternative form of the Detail "0" portion of the systems shown in FIGS. 1*a*, 1*b*, 2*a* and 2*b*, and which alternative form is identified in FIG. 14 as Detail "0'."

Figure 15A:
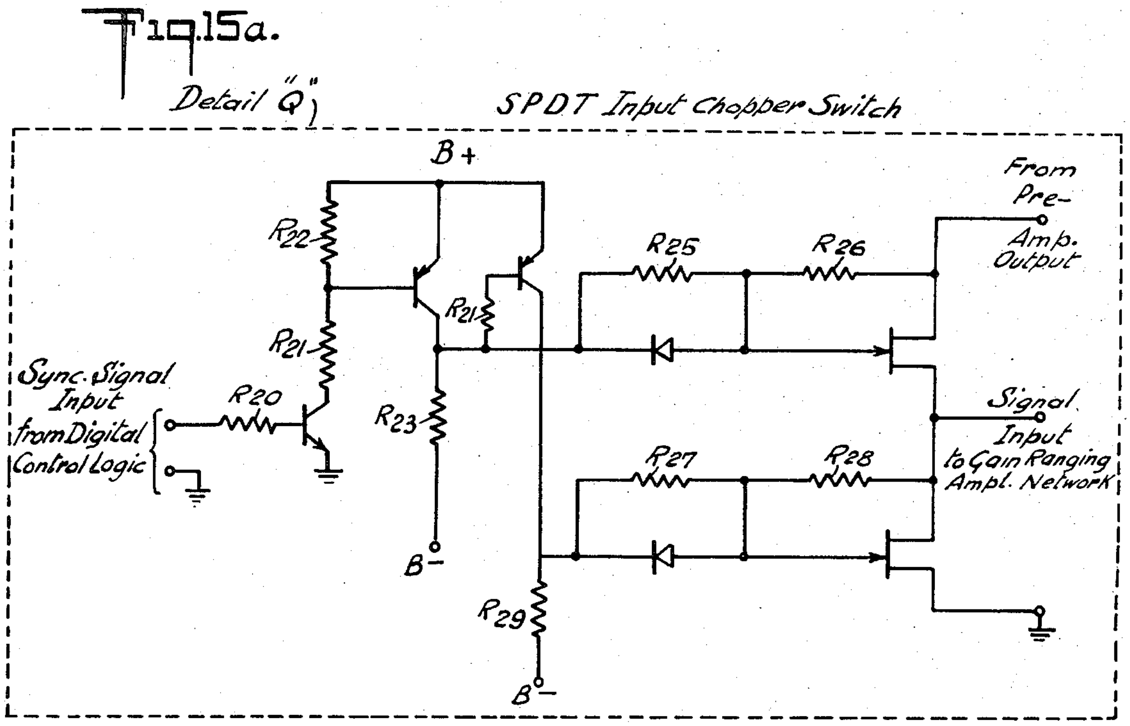

FIG. 15*a* is a schematic circuit diagram illustrating in further detail that portion of the systems shown in FIGS. 1*a*, 1*b*, 2*a*, and 2*b*, as SPDT input Chopper S*w*, identified as Detail "Q."

Figure 15B:
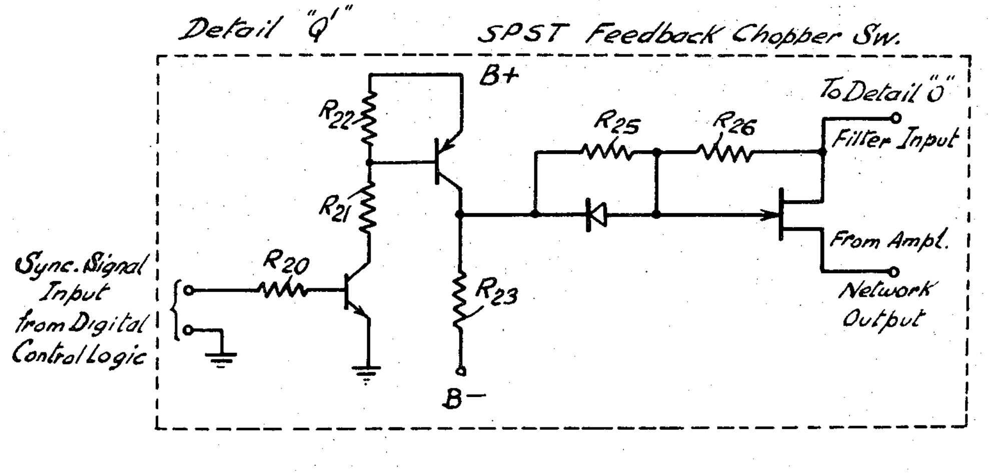

FIG. 15*b* is a schematic circuit diagram illustrating in further detail that portion of the system shown in FIGS. 1*a*, 1*b*, 2*a* and 2*b*, as SPST Feedback Chopper S*w*; identified as Detail "Q'."

Figure 16:
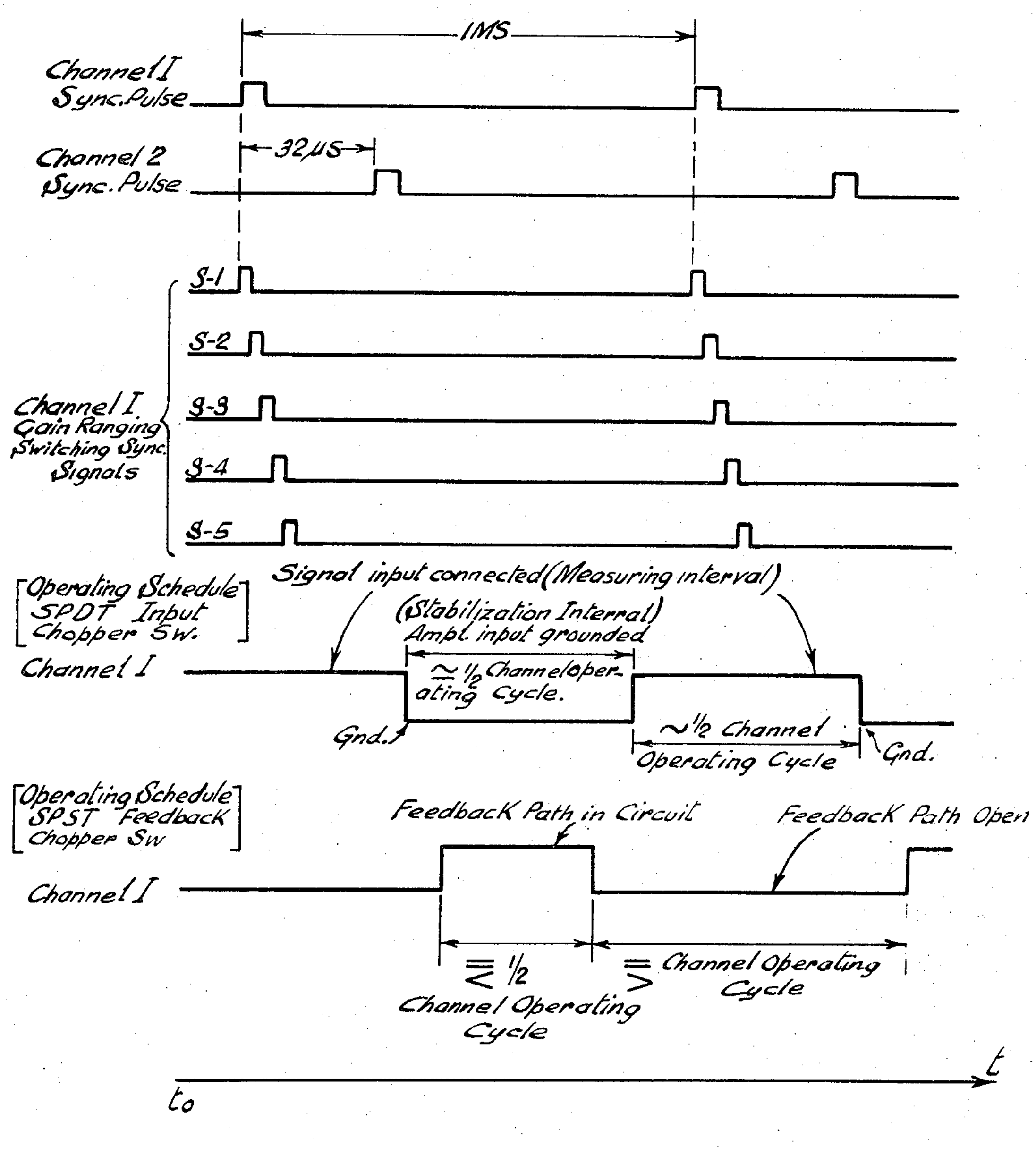

FIG. 16 is a diagrammatical representation showing the times of occurrence of the sync pulse and gain control switching pulses, relative to the occurrence of the Input and Feedback Chopper switching functions in accordance with the present invention.

The systems shown in FIGS. 1*a* and 1*b* are substantially identical except for the circuit arrangement for returning the feedback path, including Detail "0," to the input of the cascaded amplifier stages. In FIG. 1*a* the feedback path is applied to the input of the first cascaded stage $B_1'$, which is modified as shown in FIG. 10, so that the feedback signal is inserted at one end of resistor $R_2$. This differs from the other cascaded stages, shown as Detail "B," wherein the corresponding end of the resistor $R_2$ is directly coupled to common ground. In the system shown in FIG. 1*b*, the feedback path including Detail "0" is applied to the input of the first cascaded stage $B_1$ through the intermediatory of an additional stage, identified as Detail "P," as illustrated in FIG. 13 and described further hereinafter.

The distinctions between the systems shown in FIGS. 2*a* and 2*b* are similar to the distinctions described above as between FIGS. 1*a* and 1*b*.

It is conventional practice in seismic surveying to employ a plurality of geophones at successive distances from a source of seismic energy located at a shot point to detect acoustic energy arriving from the source over different travel paths during measured time intervals and to display signals representing the outputs derived from the respective geophones as adjacent traces along a time base reference. In accordance with the hereinafter disclosed system, signal information corresponding to the geophone output signals are amplified in respective signal channels, converted from analog-to-digital form and recorded on magnetic tape. Such tape recorded signals can, if desired, be reproduced, reconverted to analog form and recorded in trace form, as disclosed. However, of more importance is the fact that such digitally recorded signals can be subjected to modern data processing techniques using high speed digital computers and related equipment.

The amplifier system herein disclosed offers the further advantage of providing an output signal which can be recorded in floating point form, e.g., as a digital word comprising a mantissa and an exponent, as described in further detail hereinafter, which accurately represents the absolute value of the input signal corresponding thereto. By recording such floating point signals on magnetic tape it is possible to preserve not only the relative values but also the absolute values of the amplified signals.

In FIG. 1*a*, there is shown a seismic signal processing and recording system, including a plurality of geophones, $g_1$, $g_2$, $g_n$, indicating the presence of a plurality of such acoustic-to-electric transducing devices as determined by the particular practice in the art, for example, 12 or 24, or some other number thereof. Each of these geophones may, in actuality, comprise a group or cluster of a plurality of individual geophone instruments, with their respective outputs coupled together to provide a common geophone signal.

In FIG. 1*a*, the respective geophones $g_1$, $g_2$, and $g_n$ are shown coupled to the input portions of respective signal channels identified as channels 1, 2 and *n*, respectively. Each of these signal channels are substantially identical, with corresponding elements thereof being identified by the same reference numerals or letters, as the case may be. While three channels are shown in the illustrated embodiment, it is to be understood that channel *n* is representative of one or more such channels and that, in most cases, seismic signal processing systems of the type described will comprise 12, 24, or a larger number of channels.

Each of channels 1 through *n* comprises a plurality of amplifier stages, A and $B_1$ through $B_4$, directly coupled, e.g., DC coupled to one another in cascade circuit relationship, together with associated circuitry including a common output circuit and means for selectively coupling the output of one of the amplifier stages at a time to the common output circuit when the signal at the output of said one of the amplifier stages corresponds to a predetermined reference potential when sequentially sampled in a manner hereinafter described in detail. A feedback circuit, including the circuit elements within the dashed box identified as Detail "0," is provided from the output of the last cascaded stage $B_4$ to the input of the first cascaded stage $B_1'$. The circuit details and functions of the feedback path will be described hereinafter, with particular reference to FIG. 10 showing the elements of Detail "0" and Detail "$B_1'$."

Means including an Input Chopper *Sw.* and a Feedback Chopper *Sw.* are provided for alternately interrupting the input signal to the cascaded stages and the feedback path in substantially mutually out of phase relationship in a manner to be described in further detail hereinafter, the times of which are illustrated in FIG. 16, showing the operating schedule of the chopper switches relative to the signal sync and signal sampling schedule of the amplifier system.

Each of the amplifier channels, e.g., each of the amplifier systems comprising channels 1 through *n*, is shown coupled in a seismic signal processing and recording system including means hereinafter to be described whereby the outputs of the respective channels 1 through *n* are multiplexed on a time sharing basis so that the signals of the respective geophones $g_1$ through $g_n$ may be processed and coupled to an analog-to-digital converter and thence to a digital tape recorder (not shown).

Figures 3, 4:
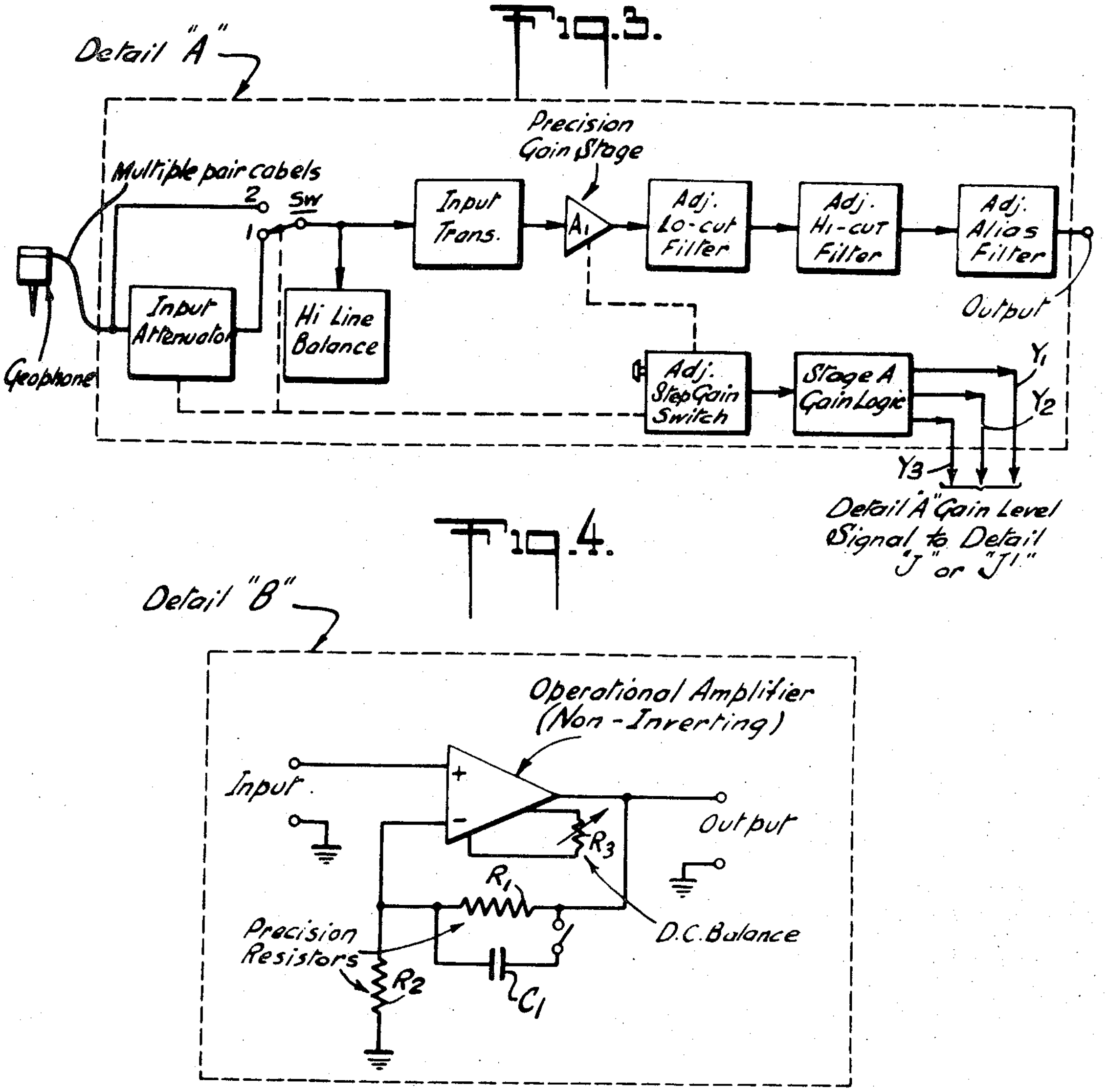
FIG. 3 is a schematic circuit diagram, in block form, illustrating in further detail the portions of the system of FIGS. 1*a*, 1*b*, 2*a*, and 2*b* identified as Detail "A."
FIG. 4 is a schematic circuit diagram, partly in block form, illustrating in further detail the portions of the systems of FIGS. 1*a*, 1*b*, 2*a* and 2*b* identified as Detail "B."

Referring particularly now to the details of that portion of FIG. 1*a* comprising Channel 1 thereof, it is seen that the output of the geophone $g_1$ is coupled to the input of the Channel 1 input circuitry, schematically shown as the block A, further illustrated in FIG. 3 as Detail "A," and which comprises a suitable input circuit such as an input transformer, a precision gain preamplifier, seismic filters, high line balance, seismic alias filter and logic gates to interrogate the input attenuator switch and precision gain stage $A_1$ and generate a binary coded signal to represent the overall gain of this stage or section of the system, in a manner described in further detail hereinafter. The combination of the input attenuator of the input electronic section, identified as Detail "A," and the precision gain preamplifier thereof are normally adjusted manually to give an overall predetermined gain to Detail "A," as determined by the operation of the system to be discussed in detail hereinafter. However, in a preferred embodiment the gain of Detail "A" should be $b^k$, so that *k* can be added to (or subtracted from) the exponent determined by the following stages of the channel. One embodiment of this system uses a value of *k* equal to unity ($k$=1.000 and $b$=8). The output of the channel 1 input section A is shown coupled through a time selective switch identified as DPST Input Chopper Sw. directly to the input of the first of a series of cascaded precision gain amplifier stages, schematically shown as blocks $B_1$ through $B_4$, each of which is further illustrated in FIG. 4 as Detail "B," (it is noted that the first cascaded stage $B_1'$ of FIGS. 1a and 2a, respectively, is connected in circuit as shown in FIG. 10, within the dashed box labeled Detail "$B_1'$" of FIGS. 1a and 2a, as described hereinafter) and which provides both alternating current (AC) and direct current (DC) amplification of a selected base value $b$ to the exponent $k$. By way of example, in one embodiment $b = 8$ and $k = 1.000$, such that $b^k - 8.000$,for both alternation current (AC) and direct current (DC) amplification. Each of the precision gain amplifier stages $B_1$ through $B_4$ are non-inverting, wideband amplifier stages, the gain of which may be set by precision resistors in the feedback loop thereof, as described hereinafter.

Each of the precision gain amplifier stages $B_1$ through $B_4$ is shown with its input circuit coupled to a respective constant voltage source schematically shown as blocks $C_1$ through $C_4$, as the case may be, each of which is further illustrated in FIG. 5 and Detail "C." Each of the voltage sources, $C_1$ through $C_4$, provides both positive and negative DC reference voltages, and includes appropriate means known to those skilled in electronics for limiting the input of the succeeding precision gain stage for the purpose of preventing large signal overloads and distortion therein. Constant voltage sources $C_1$ through $C_4$ are described in further detail hereinafter. It is to be understood that although a constant voltage source is shown serially connected in the input circuit of each of the precision gain amplifier stages, it is contemplated that the function of the constant voltage sources, e.g., to protect the respective amplifier from overloading, can be achieved by appropriate design of the amplifier per se.

Coupled to the output of the input electronics, Detail "A," including the precision gain preamplifier thereof, and likewise coupled to the respective outputs of each of the succeeding amplifier stages, identified as $B_1$ through $B_4$ of the cascade circuit arrangement, there is provided a respective bandwidth determining device schematically shown as blocks $D_1$ through $D_5$ respectively, each of which is further illustrated in FIG. 6 as Detail "D" and which comprises a phase compensation device, a gain calibration device which can either amplify or attenuate with precision, and an impedance transformer. In one embodiment of the amplifier system, each of the bandwidth determining devices $D_1$ through $D_5$ may include means for removing the DC component from the signal. Each of the devices $D_1$ through $D_5$ also includes circuit components which function as an isolation stage separating the respective outputs of the amplifier stages $B_1$ through $B_4$ from the signal input of a corresponding switching network schematically shown as the blocks $E_1$, $E_2$, $E_3$, $E_4$, $E_5$, as the case may be, each of which is further illustrated in FIG. 7 as Detail "E." In summary, therefore, each of the bandwidth devices, $D_1$ through $D_5$respectively, is shown having its respective output coupled to one of the corresponding switching networks $E_1$ through $E_5$.

Each of the bandwidth determining devices, $D_1$ through $D_5$, also includes means for adjusting it to the appropriate DC level of the common output of all switches, i.e., of the switching networks $E_1$ through $E_5$ into which the outputs of the bandwidth devices $D_1$ through $D_5$ are coupled or fed.

The bandwidth determining devices $D_1$ through $D_5$ provide means for adjusting the bandwidth of the various circuit paths from the input of a particular amplifier channel to the common output, e.g., for equalizing the successive signal paths from the input of Detail "A" through the respective electronic switch networks $E_1$ through $E_5$ to the common output comprising Detail "F," so that the bandwidths of these various paths are equalized. Preferably the various bandwidths of all paths correspond to that of the longest path, which is the path through the last of the cascaded amplifier stages, namely, that including devices $B_4$ and switch $E_5$, as shown in FIGS. 1a, 1b, 2a and 2b.

In addition to bandwidth, these devices $D_1$ through $D_5$ also provide means for adjusting the phase of the various signal paths so that they conform to the phase of the longest path as described above. It will be appreciated that when using linear circuit elements phase equalization of the various paths will also amount to bandwidth equalization thereof.

The circuitry comprising the successive Detail "D" portions of the circuit also act as isolation stages to keep the switching transients of the respective Detail "E" switching networks out of the input of the next following cascaded amplifier comprising Detail "B" of the system.

It will be appreciated that, in the illustrated embodiments, the last bandwidth determining device $D_5$, coupled between the output of the last of the cascaded amplifier stages $B_4$ and the last of the switching networks $E_5$, is not essential from the standpoint of preventing switching transients from influencing the next following cascaded stages, since there are no further cascaded stages to be affected by the last bandwidth device $D_5$. Moreover, the last bandwidth device $D_5$, while useful in equalization of bandwidth and phase, is not essential for that purpose in the context of the disclosed system inasmuch as the shorter circuit paths including preceding bandwidth devices $D_1$ through $D_4$ can be adjusted to correspond to the bandwidth of the longest circuit path including the last cascaded amplifier $B_4$ and the last switching network $E_5$.

The circuitry comprising the last device Detail $D_5$ is nevertheless useful in the illustrated embodiments to provide means for adjusting the various amplifier output paths to the DC level of the common output of all switches and is preferably employed for that purpose.

The foregoing discussion concerns the circuit described as Detail "D," shown in FIG. 6. However, it is to be understood that in accordance with the preferred embodiments of the invention, featuring improved broad bandwidth, characteristics, significant advantages are to be obtained by the use of the circuit illustrated in FIG. 6a, identified as Detail "D," rather than the circuit discussed above and identified as Detail "D."

In the circuit of FIG. 6a, it is seen that the Detail "D'"circuit comprises an operational amplifier of the non-phase inverting type, which is of the normally open input type which provides no DC blocking. Thus, this is a direct coupled DC amplifier, as distinguished from a circuit such as Detail "D," shown in FIG. 6, which is provided with a series input capacitor $C_2$ which provides DC blocking.

The use of the Detail D' configuration shown in FIG. 6a assures the provision of a DC circuit path for each of the outputs derived from the successive stages of the cascaded circuit network. This assures, together with the Detail "0" feedback loop, that the amplifier provides broad bandwidth characteristics, down to direct current.

Each of the switching networks $E_1$ through $E_5$ comprises a high speed electronic switch network including; firstly, one or more input logic gates for external signaling of "on" and "off" times; secondly, a switching device, preferably in the nature of a field effect transistor (FET); and, thirdly, a driver circuit for translating the input "on" and "off" signals into signals which activate the appropriate field effect transistor switch.

The respective outputs of each of the switching networks $E_1$ through $E_5$ are shown coupled to the input of a high speed amplifier and impedance transformer schematically shown as the block F, further illustrated in FIG. 8 as Detail "F." Thus, it is noted that the input of amplifier-transformer F is a common connection for the respective outputs of all of the switching networks, $E_1$ through $E_5$, with respect to each channel and, in fact, with respect to all channels in the embodiments illustrated in FIGS. 1a and 1b of the drawing where one amplifier-transformer F is provided in common for the entire amplifier system, e.g., with all channels thereof being connected to the input of the same high speed amplifier and impedance transformer F.

Amplifier-transformer F has a relatively higher input impedance, preferably of the order of $10^7$ times the "on" resistance of the field effect transistor switch output of the respective switching network $E_1$ through $E_5$ coupled to the input thereof. In a preferred embodiment utilizing a "follower" type amplifier stage, the output impedance of the amplifier-transformer F is essentially 0 and the gain thereof is normally unity (+1.000).

Thus, it is seen that in each channel the respective outputs of each of the cascaded amplifiers in the series circuit comprising the pre-amplifier of Detail "A" and the succeeding precision gain stages $B_1$ through $B_4$, are all shown coupled through appropriate circuitry including a respective one of the high speed electronic switching networks $E_1$ through $E_5$ to a common output circuit comprising the input of the high speed amplifier-transformer circuitry F. Moreover, in the embodiments of FIGS. 1a and 1b, the respective outputs of each of the amplifier channels, e.g., channels 1 through *n*, are shown coupled to the input of the same high speed amplifier and impedance transformer F, whereby there is thus provided a common output circuit for all channels of the entire seismic system.

It is noted that a combination of any number of the aforementioned high speed switch networks such as $E_1$ through $E_5$, together with a single high speed amplifier and impedance transformer, such as F, constitutes in the disclosed circuitry, including scanning means to be further described hereinafter, a high speed multiplexer or commutator in which relatively inexpensive switch components, e.g., field effect transistors with non-precision "on" resistance can be used, one of the principal advantages being that the switches can be replaced without recalibrating the amplifier paths.

The output of the amplifier-impedance transformer F is shown coupled to the respective inputs of first and second digital decision devices, schematically shown as the blocks H and I, respectively, which serve the function of determining when the output amplitude of the amplifier-impedance transformer F exceeds either the positive (device H) or negative (device I) reference potentials (+V or −V), schematically identified in the drawings, supplied by a source schematically shown as the Block G.

The digital decision devices H and I are known circuits of the type generally classified as "Voltage Comparators," for example, as described on pages 45 and 46 in "Handbook of Operational Amplifier Applications," published by Burr-Brown Research Corporation, Tucson, Arizona, 1963. Device G is a known circuit of the type found on page 49 of the above reference.

The reference voltage source G is a precision source having two outputs, one being a positive voltage is supplied to the device H and the other being a negative voltage is supplied to the device I. Both of the reference voltages supplied by the source G are predetermined such that when the output signal provided by the amplifier-impedance transformer F at any given instant and coupled to the digital decision devices H and I, respectively, exceeds in amplitude either the predetermined positive voltage or predetermined negative voltage, as the case may be, then a comparison signal is supplied by the appropriate decision device H or I to a Digital Control and Multiplexer Network schematically shown as the block J, further illustrated in FIG. 1a as Detail "J," and which, in turn, controls the control input of the appropriate high speed electronic switch network, e.g., appropriate Detail "E" then in the closed or conducting condition and then passing the signal under comparison so that said switch will remain closed for the duration of a sampling cycle to provide the analog-to-digital sample-hold measurement in a manner hereinafter to be described in further detail.

The Digital Control and Multiplexer Network J functions as a programmer for the high speed switches $E_1$–$E_5$. The network or programmer responds to a synchronizing signal, i.e., to a "sync" or "go" pulse transmitted thereto over the sync input channel from an appropriate digital clock, e.g., the "sync" pulse shown coupled thereto from the Analog-Digital Converter. In response to such a "sync" or "go" pulse, the programmer J functions to turn on in timed sequence the successive high speed electronic switches $E_1$ through $E_5$. The system may be operated to scan either up or down the sequence of switches, e.g., from $E_1$ to $E_5$ or from $E_5$ to $E_1$. The preferred mode of operation is to be discussed hereinafter. Let us assume that the system is programmed to scan the respective switches $E_1$ through $E_5$ of channel 1, for example, thereafter going through the succeeding channels 2 to *n*. In the course of scanning channel 1 let us assume that the switch $E_1$ is turned on by the action of the control signal $S_1$ from the digital Control Network J, in response to a "sync" or "-go" pulse from the Analog-Digital Converter and Control Logic. At that instant, a signal applied to the input of the geophone $g_1$ is translated through the input electronics A, thence, through the bandwidth determining device $D_1$ thence, through the then closed switch network $E_1$ to the common output comprising the input to the amplifiereimpedance transformer, schematically shown as the block F, which, in turn, applies to a signal simultaneously to the two digital decision devices H and I, respectively, which function to compare said applied signal with the positive and negative reference signals, +V and −V, provided thereto by the precision voltage source G. If the signal applied exceeds in amplitude either the positive reference voltage, +V, applied to H, or the negative reference voltage, −V, applied to I, as the case may be, the scanning operation controlled by the digital control network or programmer J, is effectively halted or stopped with electric switch network $E_1$ maintained or held in a closed position during the remainder of the cycle so that the output signal coupled through said switch may be translated through the amplifier-transformer F to the Analog-Digital Converter and Digital Control Logic shown coupled to the output thereof, the operation of which will be further discussed hereinafter.

Returning to the operation of the digital control network or programmer J, unlike the aforementioned situation, let us assume that switch network $E_1$ is momentarily closed in response to a signal from the digital network J and that the output of the amplifier-impedance transformer F does not exceed either the positive or negative reference potentials, +V or −V, supplied by precision source G to devices H or I, respectively, then the digital network J will function to turn "off," e.g., "open" the switch network $E_1$ and turn "on" the next succeeding electronic switch $E_2$. The signal translated to the second switch network $E_2$ will then be tested in the same manner as the signal that was supplied through the first switch network $E_1$, e.g., the same comparisons will be made with the positive and negative reference potentials, +V and −V, to determine whether or not the programmer J should "hold" or lock on to the second switch network $E_2$ in the closed condition or continue through the cycle testing, in turn, the following switch networks $E_3$ through $E_5$ until a signal exceeding the positive or negative reference potentials is supplied through one of the switching networks $E_1$ through $E_5$ by way of the amplifier-transformer F to the respective decision devices H and I. In the event that these conditions are not satisfied through the cycle, e.g., that the control network J momentarily closes $E_1$ through $E_5$, in turn, without providing a signal to H or I that exceeds the predetermined reference potentials +V or −V, then the cycle will stop with the fifth switch network $E_5$ in a closed position. The cycle will begin again in response to the next "sync" or "go" pulse transmitted to the digital control network J. In accordance with a preferred embodiment the time required for a decision on any switch connection is a minimum of one-half microsecond.

Associated with each "sync" or "go" pulse transmitted to the digital control network J there is provided a second signal, a channel number pulse, which selects a set of switches on a particular channel, e.g., one of channels 1 through *n* in sequence.

The Digital Control and Multiplexer Network J also contains the Exponent Adder and means for gating signals corresponding to three exponent digits $K_1$, $K_2$ and $K_3$ to the digital recorder. The exponent digit signals $K_1$, $K_2$ and $K_3$ are shown on the output connection coupled from the control network J to the analog-to-digital converter, designated AD Converter and Digital Control Logic in the drawings, where they are supplied to the tape writing circuits of the digital tape recorder (not shown). The exponent digit signals $K_1$, $K_2$ and $K_3$ provide information to the analog-to-digital converter identifying the gain level of the amplifier system, as determined by the gain of Detail "A" and by which one of the electronic switch networks $E_1$ through $E_5$ translates a particular signal being recorded in digital form. Otherwise stated, the signal supplied by the common output circuit including the amplifier and impedance transformer F to the analog-to-digital converter provides the value of the translated signal within a given range level, e.g., mantissa, and the exponent digits show the amplification range or level, e.g., exponent, through which that signal was translated and which is determined by the condition of the switching devices $E_1$ through $E_5$, only one of which is responsible for a given output signal supplied to the AD converter.

It will be appreciated that by thus writing, e.g., recording, a floating point digital number on the magnetic tape carried by the recorder (not shown) in the form of mantissa and exponent this number may be made to represent the absolute seismic signal amplitude as it appeared at the output of the corresponding geophone from which it originated.

It is to be understood that the analog-to-digital converter includes a sample and hold circuit and also a source of real time pulses. The sample and hold circuit serves to assure sampling of the signal applied thereto for a sufficient time to make the analog-to-digit conversion for recording in digital form on an appropriate recorder (not shown) coupled to the AD Converter outputs. The recorder may be any suitable device such as a digital tape recorder.

The functions of the Digital Control and Multiplexer Network J may be better understood and appreciated by reference to FIG. 1*a* of the drawings wherein the elements which comprise the network J are shown within the dashed box. In FIG. 1*a* the respective outputs of the two Digital Decision devices, H and I, are shown coupled to an "Exclusive OR" Gate within the Digital Control and Multiplexer Network J. The "Exclusive OR" Gate is a known type of circuit responding with an output signal only when the two input signals are digitally unlike. An output signal from the "Exclusive OR" Gate, corresponding to a signal combination from decision device H and decision device I is shown coupled to a first input, designated Enable 1, of an Amplitude Memory Logic circuit, which is a known type of circuit consisting principally of a "Set-Reset Flip Flop." The amplitude Memory Logic circuit is provided with a second input, designated Enable 2, to which is applied a timing signal from a first output of a Time Decode Register, which is a conventional circuit for performing binary-to-decimal conversion, for example, as described in " Digital Computer Primer," by E. M. McCormick, especially page 135, published by McGraw-Hill Book Company, Inc., New York 1959 (Library of Congress Catalog Card No. 58-13011). The Time Decode Register also includes second and third outputs which provide Set and Reset signals, respectively, to second and third inputs, respectively, of the Amplitude Memory Logic circuit. The Time Decode Register is programmed by signals coupled to appropriate inputs thereof from corresponding outputs of a Divide by 32 Flip Flop Counter which, in turn, is provided with a first input that is coupled to a constant frequency reference source of timing pulses, shown as 1.024 megacycle per second clock. (designated 1.024 Mc/s clock). The Divide By 32 Flip Flop Counter is also a known type of circuit for providing 32 possible timing pulses, since it is desired in the illustrated embodiment to provide a nominal 31 microsecond operating cycle and to be able to choose pulses within nominal 1 microsecond intervals. The Divide By 32 Flip Flop Counter includes a reset circuit (not illustrated, per se) and is provided with a second input for receiving Reset signals from a source of "go" or sync pulses which, as shown in FIG. 1, may be provided by the AD Converter and Digital Control Logic circuit.

The Amplitude Memory Logic circuit is provided with an output shown coupled to a first input designated input No, 1, of an "AND" gate, having a second input, designated input No. 2, coupled to an output of the Time Decode Register for coupling an Advance Switch Counter Signal to the "AND" gate. The "AND" gate may be a known type of gate circuit for responding only to the simultaneous occurrence of appropriate gating signals at inputs 1 and 2 thereof, for providing an output signal which is shown coupled to input 1 of a Switch Counter. The Switch Counter is a known type of circuit consisting essentially of a plurality of Flip Flops in cascade connection, Input No. 2 of the Switch Counter is shown coupled to a fourth output of the Time Decode Register for coupling a Preset signal from the latter to the Switch Counter.

The Switch Counter circuit is provided with a plurality of outputs, three being shown, for coupling signals designated $X_1$, $X_2$ and $X_3$ representing exponents to three corresponding inputs of the Exponent Adder. The Exponent Adder is also provided with a plurality of additional inputs, three being shown designated $Y_1$, $Y_2$ and $Y_3$, for receiving signals in binary form corresponding to the overall gain of Detail "A." The Exponent Adder, in turn, is provided with three output paths which, as shown in FIG. 1, comprise the output paths of the Digital Control Network J for coupling the exponent signals $K_1$, $K_2$ and $K_3$ from the Digital Control Network J to the analog-to-digital converter, in order to provide information as to the gain level of the amplifier system, as determined by the gain of Detail "A" and by which one of the electronic switch networks $E_1$ through $E_3$ translates a particular signal being converted and recorded in digital form. The Exponent Adder is a known type device consisting of a plurality of Flip Flops and logical "AND" and "OR" gates whose function is to add and store the digital signals presented on the input channels wherever the "Add Exponent Signal" is activated.

Output signals corresponding to the exponent signals $X_1$, $X_2$ and $X_3$ are also coupled from the appropriate outputs of the Switch Counter, as shown in FIG. 1a, to three corresponding inputs of the Gain Switch Logic and Multiplexer circuitry which, in turn, is provided with appropriate output circuits, as shown, for each of channels 1 through $n$ for coupling appropriate channel switching signals $S_1$ through $S_3$ to the appropriate switching network $E_1$ through $E_3$ of each of channels 1 through $n$, in order to control or program the switching networks $E_1$ through $E_3$ of each of the channels 1 through $n$, as shown in FIGS. 1a and 1b.

The Gain Switch Logic and Multiplexer circuit is also provided with a plurality of input circuits for receiving channel number signals coupled thereto from the AD Converter and Digital Control Logic, also as shown in FIGS. 1a and 1b of the drawings. The function of the channel number signals is to correlate or synchronize the functioning of the Gain Switch Logic and Multiplexer so that the channel programming signals occur according to desired sequence. The Gain Switch and Multiplexer circuit is a conventional circuit for performing binary-to-digital conversions.

Figure 1C:
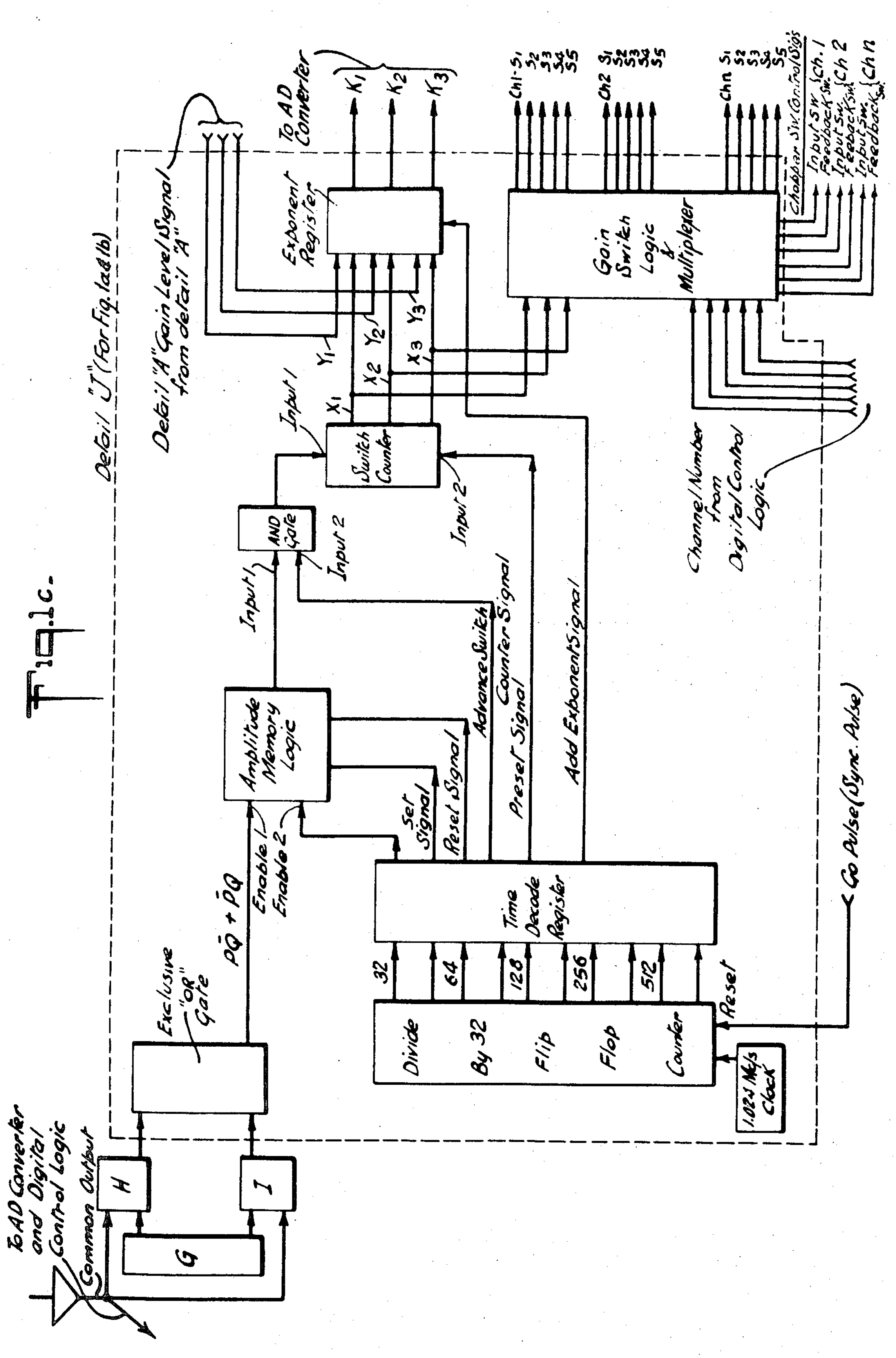

In the apparatus of FIGS. 1a and 1b, including the Detail "J" portion thereof illustrated in FIG. 1c, multiplexing of the various channel switching networks $E_1$ through $E_3$ is accomplished by means including the Gain Switch Logic which functions to program or control the sequence according to which of the switching signals, $S_1$ through $S_3$, are applied, in turn, to the switching networks $E_1$ through $E_3$ of the respective channels 1 through $n$.

The Gain Switch Logic and Multiplexer is programmed to cycle time-sequentially through all switch networks, $E_1$ through $E_3$, of a given channel and then to cycle through the switch networks, $E_1$ through $E_3$, of the next channel, and so on through respective channels 1 through $n$. In the illustrated case, the switching proceeds from channel 1 on through channel $n$; however, it is to be understood that the numerical order of events may be reversed. In any event, the selection of the sequence of channels is determined by the channel number signals applied to the Digital Control Logic and Multiplexer Network J which, in turn, is controlled as a function of the signals provided by the AD Converter and Digital Control Logic illustrated in FIGS. 1a and 1b.

The Gain Switch Logic also incorporates means for providing the control signals for the SPDT Input and SPST Feedback Chopper Switches shown in FIGS. 1a, 1b, 2a and 2b. The timing of these control signals is described in further detail hereinafter, and illustrated in FIG. 16.

The foregoing detailed description of FIG. 1a, applies equally to the description of the system shown in FIG. 1b, except for the details of the feedback circuit including Detail "O" and associated elements, as discussed above and described further hereinafter.

In the system of FIG. 1a, negative feedback is provided by the feedback loop including the Detail "O" active filter, coupled to the input of the first cascade amplifier stage $B_1'$, which is a modified version of the other cascade amplifier stages of FIG. 1a, namely, stages $B_2$ through $B_4$, as shown in FIG. 4. The modified cascaded stage $B_1'$ is shown in FIG. 10 as being identical with the other cascade stages, except for the fact that the terminal end of the resistor $R_2$ is coupled to the output of the feedback loop, e.g., the output of the Detail "0" filter network, rather than being coupled directly to ground as with the other cascade stages as shown in FIG. 4.

The Detail "0" portion of the feedback loop comprises an active filter having a high-frequency rollcharacteristic and a characteristic gain of at least unity. In the illustrated embodiment the Detail "0" filter network is provided with a gain of unity, as determined by the feedback loop coupling the output terminal of the operational amplifier to the negative input terminal thereof, as shown in FIG. 10.

As seen in FIG. 10, the Detail "0" portion of the feedback loop comprises a Detail "N" portion, in the form of a network of resistors and capacitors, the values of which may be selected to provide the desired frequency characteristic of the Detail "0" circuit, together with an active stage comprising an operational amplifier shown provided with the aforementioned feedback loop from its output end to its negative input terminal in order to provide the specified unity gain for the active filter comprising the Detail "0" circuitry. The Detail "0" circuitry should have a gain of at least unity, and is shown as a positive gain of unity (+1) in the illustrated embodiment. It is to be understood that a negative gain of at least −1 may be chosen, in which event it will be necessary to make an appropriate change in the manner of supplying feedback to the input of the cascaded network in order to assure injection of the feedback in proper phase relationship with the input signal.

A further embodiment of the feedback filter is illustrated in FIG. 14 wherein it is identified as Detail "0′." This alternate filter embodiment is substantially the same as that shown in FIG. 10 as Detail "0," except for modification of the detail "M" portion in order to provide gain greater than unity. In FIG. 14, the modified portion of the circuit is identified as detail "M′" wherein it is seen that additional resistors $R_{17}$ and $R_{18}$ are provided in the circuit of the operational amplifier in order to enable adjustment of gain, which is determined by the ratio of the value of the resistors $R_{17}$ and $R_{18}$. In FIG. 14, $R_{17}$ is connected between the negative terminal of the operational amplifier and ground, and $R_{18}$ is connected directly between the output terminal and the negative terminal of the operational amplifier. Since the details of such operational amplifier circuits are well known in the electronics arts, further discussion thereof is not deemed necessary.

The feedback loop including the active filter illustrated herein as Detail "0" or Detail "0′" functions in conjunction with the Input Chopper Sw. and the Feedback Chopper Sw. to permit the derivation of a feedback drift correction signal by selectively sampling the output of the cascaded amplifier network during times when the amplifier input signal is interrupted by opening the Input Chopper Sw. and connecting the input terminal of the first cascaded stage to ground so that the cascaded amplifier network is rendered completely free of input signals with the result that the output of the final cascaded stage varies only in accordance with internal amplifier variations, e.g., amplifier drift to the extent that the same may be present. By closing the Feedback Shopper Sw. during such signal-free amplifier intervals, hereinafter designated stabilization intervals, a drift signal can be derived from the cascaded amplifier network and applied to the input of the feedback active filter, Detail "0" or Detail "0′," for use in correcting for such drift by negative feedback. This drift signal is a measure of drift or other amplifier variations, free of signal influence. The drift signal is stored in the feedback filter, as determined by its time constant, and then inserted into the input of the cascaded amplifier network as a feedback drift correction signal during the next measuring interval of the amplifier system when the input chopper switch is closed and ungrounded by operation of the Input Chopper Sw. The precise cycle of operation is set forth with greater detail hereinafter.

With particular reference to FIGS. 1*b* and 2*b*, which are preferred modifications of the systems shown in FIGS. 1*a* and 2*a*, respectively, it is seen that the output of the feedback loop including the active filter Detail "0" is coupled to the input of an additional amplifier stage, Detail "P," inserted between the output of the input electronics "A" and the respective inputs of the constant voltage source $C_1$ and the bandwidth determining device $D_1$ or $D_1'$ as the case may be. The details of the circuit identified as Detail "P" and its manner of its connection to the aforementioned adjacent circuits is shown in FIG. 13, wherein it is seen that the Detail "P" circuitry comprises means for providing a constant input impedance regardless of the input signal by isolating the effect of the constant voltage source $C_1$ on the input electronics comprising Detail "A." Otherwise stated, the Detail "P" portion of the circuit provides a low impedance drive to the clipper circuit comprising the constant voltage source $C_1$. The detail "P" stage comprises an operational amplifier with a gain of 2 in combination with a network of resistors for attenuating the gain by a factor of one-half so that Detail "P" has a net gain of unity (1) for signals applied to each of its inputs. It also provides a summing point for introducing the feedback from Detail "0" to the input of the cascaded amplifier network along with the signal from the input electronic A.

It is further observed that the Detail "0" active circuitry shown in FIG. 10 together with the input and feedback switching means provides substantially 100 percent negative feedback for DC. This allows the gain stages of the cascaded amplifier network to be DC coupled throughout and still have DC stability. An important advantage of this circuit utilizing chopper stabilization is to sample for a correction of the DC drift at a time when the input AC signals are not present. This DC correction is applied during the time the input AC signals are present. For all but very small signals, some of the gain stage signals will be saturated due to the diode clipping circuits shown in Detail "C." An AC amplifier will not pass such a clipped signal and distortion may result, as illustrated in FIG. 11 by the dashed line X, showing possible tilt errors. The solid line Y illustrates the correction provided to a very high degree by the subject invention, as described by the legend on the drawing.

The response of the feedback filter stage, Detail "0," is shown in FIG. 12 of the drawing, as having a high frequency roll-off characteristic at $f_1$, which in a preferred embodiment may be of the order of $10^{-3}$ to $10^{-5}$ cycles per second. The solid line in FIG. 12 shows a somewhat idealized plot and the dashed line a typical actual plot of the response of an embodiment of Detail "0," wherein the response is shown "rolling-off" at a value approaching 12 db per octave. The roll-off should preferably be at least 6 db per octave, but less than 12 db per octave, since "ringing" oscillation may occur at 12 db per octave. In a preferred embodiment the filter is characterized by an initial "roll-off" approaching 12 db per octave, changing to 6 db per octave for about the lower one-third of its range. This advantageous combination 12 db – 6 db roll-off may be provided by proper selection of $R_{11}$ shown in FIG. 12, Detail N, between capacitor $C_3$ and ground.

The Detail "0" feedback filter is thus characterized as a low pass filter, "rolling-off" at a low frequency, as determined by its pass band characteristic described above and shown in FIG. 11.

The SPDT Input Chopper *Sw*., which is employed to selectively connect input signals to the cascaded amplifier network or alternately connect the input terminal thereof to ground, is a conventional electronic switch, the operation of which may be controlled by electric gating signals in known manner during time intervals appropriate to carry out the functioning of the system as herein described. A typical circuit suitable for such purposes is the SPDT electronic switch illustrated in FIG. 15*a* as Detail "Q," which is a known type of single pole double throw electronic circuit incorporating field effect transistors commonly designated FET. The SPDT Input Chopper *Sw*. can be controlled by applying to the switch control input terminals thereof suitable control signals derived from the Digital Control and Multiplexer Network, applied in predetermined time schedule to control the impedance across the respective output terminals thereof such that the center terminal thereof coupled to the input terminal of the amplifier network will either be connected to the *Sw*. terminal connected to the input electronic A or to the Switch terminal connected to ground. Typical switches of this category are those marketed as Hibred Circuit Switch No. 2126–DG by Amelco Semi-Conductor (a Teledyne Company), Mountainview, California.

In FIG. 15*b*, there is shown a circuit, identified as Detail "Q'," comprising a double pole single throw electronic switch suitable for performing the functions of the SPST Feedback Chopper Sw. of FIGS. 1*a*, 1*b*, 2*a*, and 2*b* in response to gating signals provided by the Digital Control and Multiplexer Network. The circuit of FIG. 15*b* is identical with that portion of the circuit of FIG. 15*a* required to selectively connect and disconnect the input of the amplifier, e.g., that portion required selectively to make and break one signal path. The FIG. 15*b* circuit does not include circuit components corresponding to those of FIG. 15*a* required to close the signal input path to ground when the signal path between the other two switch terminals is in the open position.

The operation of the herein disclosed chopper stabilization circuit, including the Detail "0" or Detail "0'" feedback loop together with the SPDT Input Chopper *Sw*. and the SPST Feedback Chopper *Sw*., may be better understood by reference to FIG. 16 of the drawing. This stabilization circuit operates to provide a correction voltage at the input of the cascaded amplifier network which is suitable to correct for variations which would otherwise occur at the output thereof due to amplifier drift. This is accomplished by selectively sampling the output of the cascaded network, e.g., at the output of the final cascaded stage B4 during times when the input signal to the amplifier network is interrupted by opening the path from the preamplifier A to the cascaded stages and grounding the amplifier input terminal to assure isolation of the amplifier network, both through the operation of the SPDT Input Chopper S*w*., while at the same time closing the SPST Feedback Chopper S*w*. to provide a signal path from the output of the last cascaded amplifier stage to the input of the feedback network filter Detail "0" or "0'." D.C. voltage variations resulting from amplifier drift, which would otherwise cause undesired variations in the indicated signal output of the amplifier network, are then transmitted to the Detail "0" filter during a stabilization interval, e.g., in the absence of input signals, and a drift signal is stored in the feedback filter to provide a reference corresponding to the magnitude of the drift determined during the stabilization interval. This drift signal is applied through the feedback loop to the input of the cascaded amplifier network in appropriate phase relationship to provide a corrective voltage which cancels out the drift condition so that when the SPDT Input Chopper S*w*. is again operated to disconnect the ground and reconnect the input signal from the preamplifier A the amplifier will transmit signals during the measuring interval while the amplifier is being stabilized against drift, during times that the input signal is connected to the cascaded amplifier network for gain level selection and transmission through the amplifier system to the AD converter, e.g., during the sample and hold intervals of the gain level selection switches.

The active filter of the feedback loop is provided with a relatively large time constant so that it is capable of storing a charge proportional to the drift determined at the output of the cascaded network when the SPST Feedback Chopper S*w*. is in a closed position during the stabilization interval. In the illustrated embodiment the Detail "0" and the Detail "O'" circuits have time constants determined by capacitors $C_4$ & $C_5$ of the RC network. A charge is stored on the capacitor $C_4$ which is proporational to the drift. Thus, the drift of the cascaded amplifier network is sampled and stored as a charge on capacitors $C_4$ & $C_5$ of the filter network of Detail "0" and "0'" while the amplifier input signal is interrupted by the SPDT Input Chopper S*w*. and the input is also grounded by the SPDT Input Chopper S*w*. Then, with the Feedback S*w*. in the open position and the input signal restored to the input of the amplifier network, the signal corresponding to drift, which is stored on capacitor $C_4$ of the filter network, is applied to the amplifier input out of phase with the drift, thus effectively cancelling it from the amplifier to provide an output signal free of drift during the measuring intervals. In summary, the chopper stabilization system operates to sample drift at the output of the amplifier network during a stabilization interval in the absence of input signals to derive a drift signal corresponding to the system drift which is stored in the active filter of the feedback loop and fed back to the input of the amplifier out of phase with the drift so that the drift is eliminated during measuring intervals when the signal is being translated through the amplifier.

In FIG. 16 there is shown the relative times of occurrence of the sync pulse for channels 1 and 2 in correlation with the occurrence of the gating pulses for the gain ranging switches $S_1$ through $S_5$ of channel 1, indicating the completion of a cycle of sampling and measuring, e.g., the sample and hold intervals of the amplifier network for channel 1. Below the graphic illustrations of the sync pulses and channel 1 gating pulses are shown a plot of the times during which the SPDT Input Chopper Sw. and the SPST Feedback Chopper Sw. are operated in their respective modes. It is seen that the input to the amplifier is connected to the preamplifier during the entire measuring interval of the amplifier for the channel under consideration, e.g., during the entire sample and hold period of the channel. Thereafter, when the SPDT Input Chopper Sw. operates to open the input terminal and ground the input of the amplifier network during a stabilization interval, there are no measurements being made by the amplifier system, i.e., no signal is being translated through the amplifier system from the input to the AD converter.

Shortly following operation of the channel 1 SPDT Input Chopper Sw. to open the signal input path of the cascaded amplifier network and ground said input, the channel 1 SPST Feedback Chopper Sw. operates to connect the feedback path to the input of the active filter. The channel 1 SPST Feedback Chopper Sw. operates again to open the feedback path prior to termination of the stabilization interval when the SPDT Input Chopper Sw. is again operated to remove ground from the input of the amplifier network and restore the signal input connection to the amplifier network. Although the portions of the duty cycles for the Input Chopper Sw. and Feedback Chopper Sw. may be equal for an ideal switch, due to transients immediately following operation of the switches it is preferable in a practical embodiment that the feedback path be out of circuit for more than one-half of the operating cycle. More particularly, the feedback path is in circuit during an interval which begins and ends entirely within the stabilization interval.

It will be appreciated that the prescribed circuit configuration for the sampled feedback loop, together with the DC coupling provided for the cascaded amplifier stages, eliminates the tendency to tilt for wave forms following the first limited input, as illustrated in FIG. 11. The net effect of the application of DC coupling and the sampled feedback loop is such that the DC drift error at each stage output is effectively the same as the error of each individual stage when it is disconnected from all other stages.

It is to be appreciated that the individual cascaded stages each have the same gain for both AC and DC, and the amplifier network including the sampled negative feedback loop has substantially the same AC gain and overall DC gain.

Referring now to FIGS. 2*a* and 2*b*, there are shown other embodiments of the present invention, generally like those of FIGS. 1*a* and 1*b*, respectively, except for the means for performing the multiplexing functions. In the embodiments of FIGS. 2*a* and 2*b* multiplexing is provided by a common Channel Multiplexer, with programming provided by the modified Digital Control Network shown as the block J′, and which is further illustrated in FIG. 2*c* as Detail "J′," as described in further detail hereinafter. The embodiments of FIGS. 2*a* and 2*b* differ from one another in a manner similar to the differences between the embodiments of FIGS. 1*a* and 1*b*, e.g., with respect to the feedback path including Detail "0," which is coupled directly to the negative side of the operational amplifier of the $B_1$ stage in FIG. 1*a* (as shown in FIG. 10), rather than through an additional stage such as Detail "P" (as shown in FIG. 13).

Whereas the outputs of all of the respective channels 1 through *n* of the FIGS. 1*a* and 1*b* embodiments are coupled to the input of a common impedance matching element F, in the FIGS. 2*a* and 2*b* embodiments there is provided a separate amplifier-impedance transformer F for each of channels 1 through *n*. The respective outputs of each of the separate impedance matching circuits F are shown coupled to respective inputs of the Multiplexer having its common output coupled to the respective inputs of the Digital Decision Devices H and I for comparison with +V and −V reference voltages in a manner like that described above with respect to the operation of the embodiments of FIGS. 1*a* and 1*b*.

Figure 2C:
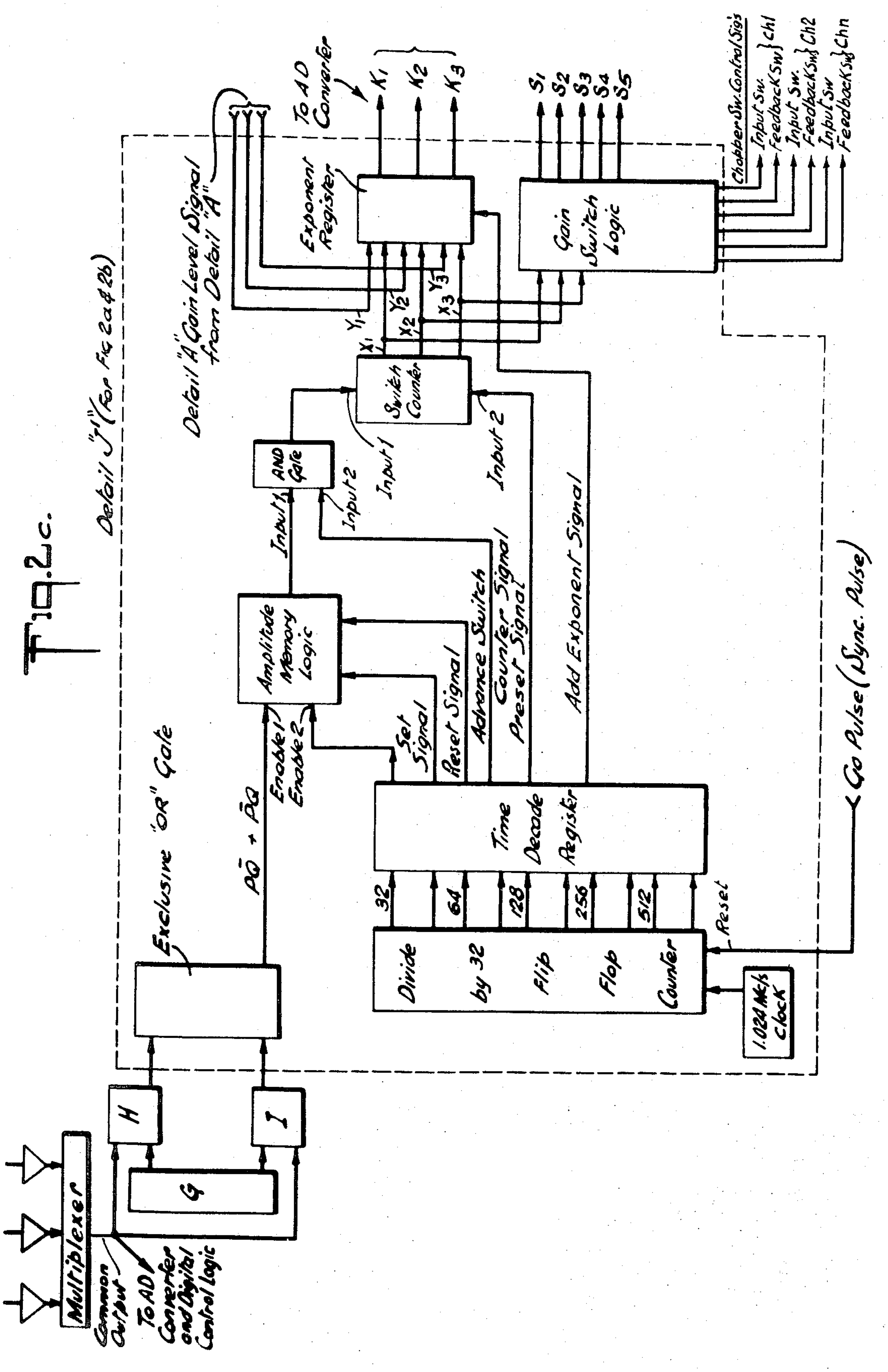

In addition to a respective signal input circuit coupled to the corresponding output of the impedance matching circuit F of each of channels 1 through *n*, the Multiplexer of FIGS. 2*a* and 2*b* is also provided with a sync input shown coupled to an output of the AD Converter and Digital Control Logic circuitry for receiving a sync pulse to synchronize the operation of the Multiplexer, which functions in response to a synchronizing pulse to program or gate the output signals supplied by the respective channels 1 through *n* in time sequence, for selectively sequentially coupling the outputs of the respective channels through the Digital Decision Devices H and I to a modified Digital Control Network J′, the details of which are shown in greater detail in FIG. 2*c*.

The modified Digital Control Network J′ is substantially identical with the Digital Control Network and Multiplexer J shown in FIG. 1*c*, except for the Gain Switch Logic portions thereof, e.g., the switch and channel decode logic. In the Digital Control Network and Multiplexer J of FIGS. 1*a*, 1*b* and 1*c*, the Gain Switch Logic and Multiplexer circuitry incorporates means for performing the multiplexing function in response to signals from the AD Converter and Digital Control Logic, as indicated. In the modified Digital Control Network J′ of FIG. 2*c*, on the other hand, there is no provision for such multiplexing, the latter function being performed by a separate Multiplexer, as shown in FIGS. 2*a* and 2*b* of the drawing.

In the system of FIGS. 2*a*, 2*b* and 2*c*, the Gain Switch Logic is provided only with inputs to receive the Switch Counter signals $X_1$, $X_2$ and $X_3$ and is provided with output circuits $S_1$ through $S_5$ each of which, as shown in FIGS. 2*a* and 2*b*, is coupled in common circuit to the corresponding switching element $E_1$ through $E_5$ of the respective channels. Otherwise stated, in the apparatus of FIGS. 2*a* and 2*b*, including the detailed showing of the modified network J′ illustrated in FIG. 2*c*, it is seen that the correspondingly numbered switching networks for all channels 1 through *n* are simultaneously actuated by switching signals from the modified Digital Control Network J′. By way of example, a switching signal $S_1$ simultaneously actuates switching networks $E_1$ of channels 1 through *n*, switching signal $S_2$ simultaneously actuates switching networks $E_2$ of channels 1 through *n*, and so on with switching signal $S_3$, $S_4$ and $S_5$, in turn, simultaneously actuating the corresponding switching networks $E_3$, $E_4$, and $E_5$, respectively, of all channels 1 through *n*.

In operation, the Multiplexer of FIGS. 2*a* and 2*b*, selectively gates only one channel at a time to the Digital Decision Devices H and I, and simultaneously to the AD Converter. Thus, the Multiplexer selectively gates or passes signals applied thereto from channel 1 during the entire period of time when the Digital Control Network J' scans through signals $S_1$ through $S_5$ in order to scan through the channel switching cycle from switching network $E_1$ to network $E_5$. Thereafter, allowing time for the "Sample Hold" operation in the AD Converter, the Multiplexer disconnects the channel 1 input and selectively passes the output of channel 2 to the Digital Decision Devices H and I and to the AD Converter for a time interval sufficient for the Digital Control Network J' again to scan through the cycle of switching signals $S_1$ through $S_5$ in order to scan through the channel 2 switching cycle switching network $E_1$ to network $E_5$, and then allowing time for the "Sample Hold" operation. In like manner, the Multiplexer, in turn, selectively gates through the successive channels, on through channel *n*, each channel being gated through the Multiplexer substantially only for the time interval required by the digital control network J' to cycle through switching signals $S_1$ through $S_5$, plus the time required to perform the "Sample Hold" operation. After the Multiplexer cycles through all channels 1 through *n*, as above, the cycle is repeated.

The portions of the circuits shown in one or more of FIGS. 1*a*, 1*b*, 1*c*, 2*a*, 2*b* and 2*c*, identified as Details "A" through "F," are shown in further detail in FIGS. 3 through 8, respectively. The circuit portions identified as Details "M" through "P" are shown in FIGS. 10 and 13, as the case may be, all as discussed above.

In FIG. 3 the elements of the input electronics are shown within the dashed box identified as Detail "A" having an input coupled to an external source of seismic signals shown as a Geophone. In particular, the input electronics of Detail "A" comprises an Input Attenuator having its output coupled through a selector switch SW to a high-line balance, identified as Hi Line Balance, and to an Input Transformer. The selector switch SW, working in ganged-switch relationship with Detail "A" Step Gain Control, enables an operator selectively to bypass the Input Attenuator by means shown as an input by-pass conductor shown coupled between the output of the Geophone and the second terminal of the switch SW. The selector switch may be of the double-throw-single-pole type for selectively connecting either the Input Attenuator (at switch terminal 1) or the by-pass conductor (at switch terminal 2) in circuit between the Detail A input, shown coupled to the Geophone output, and the respective inputs of the High-Line Balance and Input Transformer.

The Input Transformer, shown in block form, may comprise appropriate conventional input and output windings, the latter of which is connected to the input gain stage preamplifier $A_1$. The Input Transformer serves to isolate the Geophone and input cable from the Amplifier $A_1$ and succeeding circuitry, thereby allowing conventional bridge balancing or cancellation techniques to be used, if desired, to "buck out" or remove spurious power line, i.e., 60 cycle interference due to both inductive and capacitive effects at the amplifier input. Such unwanted power line signals may be removed by the high-line balance.

The precision gain stage amplifier $A_1$ is provided to amplify the desired input signals sufficiently to overcome undesired input noise level of active filters following this stage of gain. These active filters are shown in FIG. 3 coupled to the output of the Amplifier $A_1$ in series circuit in the order named. They comprise an adjustable low cut filter (Adj. Lo-Cut Filter) an adjustable high-cut filter (Adj. Hi-Cut Filter), and an adjustable aliasing filter (Adj. Alias Filter). In one embodiment the input amplifier $A_1$ of Detail "A" may have a gain of 8.0 overall; or some other predetermined gain, if the input attenuator is connected in circuit by positioning the switch SW to switch position 1, as shown in FIG. 3.

Means are provided for adjusting the overall gain of the Detail "A" input electronics portion of the system including a step gain control, identified as "Adj. Step Gain *Sw*." in FIG. 3, which can be manually adjusted and which, in a preferred embodiment, is also provided with means, identified in FIG. 3 as "Stage "A" Gain Logic," for deriving output signals in binary form, as shown as $Y_1$, $Y_2$ and $Y_3$, corresponding to the overall gain of the Detail "A" input electronics and which binary signals are coupled by suitable conductors to the Digital Control Network J or J', as the case may be. In particular, the digital signals corresponding to the Detail "A" gain level are shown coupled to inputs $Y_1$, $Y_2$ and $Y_3$ of the Exponent Adder portion of the Digital Control Network J or J', as shown in FIGS. 1A and 2A, respectively. The function of the gain level signals is to adjust the Exponent Adder of the Digital Control Network J or J' so that its exponent output signals will automatically be adjusted to take into account the gain level of the input electronics A. In the event that the input electronics A has a predetermined gain other than 8, it may be necessary to provide additional digital signals to or from the Exponent Adder, e.g., four signal lines to give powers of 2 or 4, rather than three as shown for powers of 8.

Although the disclosed system includes means for automatically introducing the predetermined gain level of the input electronics A into the Exponent Adder in order to adjust the exponent signals for the appropriate input electronics gain level, it is also contemplated that the Exponent Adder may be adjusted manually, to take into account the predetermined gain level manually established for the input electronics. It will be appreciated that the overall gain level of the input electronics A can be adjusted in known manner, as by the use of a suitable voltage divider (not specifically shown) in the Input Attenuator, in a manner designed to preserve the input impedance thereof, and by appropriate adjustment of feedback (not specifically shown) within the Precision Gain State $A_1$ in order to adjust the gain thereof. It is further understood that the adjustments of the Input Attenuator and gain of the Precision Gain Stage $A_1$ may be mechanically synchronized or ganged. Otherwise stated, the digital gain level signals derived from the Detail "A" electronics provides means by which the logic gates comprising the Exponent Adder of the Digital Control Network are able to interrogate the Detail "A" circuit and adjust the exponent signals accordingly in known manner, as indicated in FIG. 3 by the respective dashed lines from the Input Attenuator and the Precision Gain Stage to the Adj. Step Gain Sw. comprising the Detail "A" gain level control. Moreover, the setting or position of the Detail "A" gain level control can be readily communicated in conventional manner to the Exponent Adder as by means of appropriate electrical connections indicating the position of the Adj. Step Gain Sw. together with conventional means, shown as the Stage A Gain Logic, for deriving suitable binary coded signals $Y_1$, $Y_2$ and $Y_3$ representative of the setting of the Adj. Step Gain Sw. which, in turn, represents the preset gain level of the input electronics comprising Detail "A." The Detail "A" portion of each of the respective channels 1–*n* ordinarily should be at substantially the same gain level. Accordingly, the Adj. Step Gain Sw. comprising the gain level adjustment of the respective channels 1–*n* will ordinarily be set at the same or corresponding level and may conveniently be synchronized or ganged, as by appropriate mechanical coupling from one channel level controller to another. In such event, it will be necessary to provide a Stage "A" Gain Logic circuit in only one of the channels for providing a Detail "A" gain level signal to the Digital Control Logic "J" or "J'". Coordination of the Detail "A" gain level of the respective channels 2–*n* with that of channel 1 is illustrated by the dashed lines connecting the respective Detail "A" portions of channels 2 and *n* with the line representing the signal cable carrying the Detail "A" gain level signals from channel 1 to the Digital Control Network J or J'.

In the circuit designated Detail "B," as shown in FIG. 4, a transistorized wide band operational amplifier, such as that marketed as the "NEXUS SQ–1," is used in a non-inverting configuration. The precision gain is determined by the precision resistors $R_1$ and $R_2$ of the feedback network. The capacitor $C_1$, shown coupled across the resistor $R_1$ in the feedback loop, determines the high frequency cut-off point of the cascaded network of amplifier stages $B_1$ through $B_5$, shown in FIG. 4*a* as $f_2$, of the amplifier network. The resistor $R_2$, shown D.C. coupling the negative side of the operational amplifier to ground (except for stage $B_1'$, shown in FIG. 10 and described in detail elsewhere herein) determines the low frequency cut-off point of the amplifier network shown in FIG. 4*a* as $f_1$. In a preferred embodiment, the gain of each one of the cascaded amplifier stages is a constant +8.000 in the pass band down to DC. A balancing adjustment may be provided to correct for input offset voltages in the operation amplifier of the Detail "B" stage, and is shown as an adjustable resistor $R_3$ for DC balancing within the operational amplifier.

The details of the circuit network designated Detail "C" are shown within the dashed box of FIG. 5, wherein a limiter circuit is shown which clips off the output signal from any preceding stage, thus limiting the input voltage swing to any following stage to a value such that when amplified by a gain of +8.000 (in the illustrated embodiment) the following stage will not saturate. The limiter circuit C comprises a series input resistance element $R_4$, having its output end coupled to the electrical mid-point of a pair of diodes, identified as Diode 1 and Diode 2, which, in turn, are coupled in series circuit between a negative source (not shown) of direct current (−DC) and a positive source (not shown) of direct current (+DC). This limiter assures that the operational amplifier will not exceed the linear region of operation. Substantailly no distortion will then be found in the "on-scale" amplitude range (i.e., 0.512 volts to 4.096 volts) at the output of the following Detail "B" stage. In a preferred embodiment, the signal is limited at about 0.7 + 0.1 volts = 0.8 volts at the input giving 0.8 × 8.0=6.4 volts maximum at the output of the following Detail "B" stage. The operational amplifier of Detail "B" is capable of swinging its output in a range +10 volts to −10 volts linearly. The clipping or limiting of the Detail "C" circuit introduces distortion during the clip period but not during the lower "on-scale" amplitude excursions. The first and second diodes shown coupled in series between the −DC and +DC low voltage sources (not shown), are coupled to precision voltages, supplied from low impedance regulators, having values of −0.7 volts and +0.7 volts, respectively, in the embodiment shown. The midpoint of the first and second diodes is coupled to the output end of a resistance element $R_4$ shown coupled in series between the input and output of the Detail "C" circuit. In a preferred embodiment resistance $R_4$=5.1 k ohms. The first and second diodes are capable of coming out of conduction quickly, e.g., they have a characteristic fast recovery. The diodes do not conduct until the input voltage swing exceeds the back bias voltages plus or minus 0.7 volts. At this point, a voltage drop occurs across the resistor $R_4$ due to the diode current flow and the output remains substantially at plus or minus 0.7 + 0.1 = 0.8 volts during the limiting process. It will be appreciated, as suggested above, that a low impedance source of bias voltages, plus and minus 0.7 volts, is required to provide the "stiff," e.g., highly stable, bias required.

The circuit designated Detail "D," shown within the dashed box of FIG. 6, comprises an operational amplifier connected in a phase inverting configuration network to provide a nominal gain of −1.000 with both gain and phase compensation adjustments being provided. The legends in the drawing describe these functions. A DC balance is required to correct for the input offset voltage of the operational amplifier and is provided by an adjustable resistor $R_8$ within the operational amplifier. A capacitor $C_2$ is provided in series with the input to block DC from the input stage of the operational amplifier. This capacitor $C_2$ may be eliminated if offset and drift voltages at DC are adequately controlled. Either the inverting or non-inverting version of such an operational amplifier can be used without a significant change to the function of the Detail "D" stage. A 180° phase inversion is the only difference and this can be corrected by reversing geophone connections at the input transformer, e.g., at the input to Detail "A." In a typical embodiment, gain and phase differences between forward paths in any channel can be adjusted to a desired accuracy of 0.1 percent or better regardless of the number of gain stages involved. In a forward path from the geophone to the analog-to-digital converter input, the bandwidth of the overall amplifier path can also be narrowed or adjusted by the phase shift condensor $C_3$ across the feedback resistors $R_5$ and $R_7$ from output to input shown in Detail "D."

The circuit shown in FIG. 6a as Detail "D'" is to be preferred over that shown in FIG. 6 as Detail "D," since it enables significantly better bandwidth characteristics to be provided for the disclosed system. Details "D" and "D'" differ in certain respects, including the following: whereas Detail "D" provides only AC gain, Detail "D'" provides both AC and DC gain; whereas Detail "D" provides negative gain of unity (−1), Detail "D'"provides positive gain of unity (+1); whereas Detail "D" includes a phase adjusting network, none is provided for Detail "D'" and none is needed. Although means are not shown in FIG. 6a for adjusting the DC offset of Detail "D'," it is to be understood that such may be provided by means of a balance resistor like $R_8$ of Detail "D," shown in FIG. 6. It is noted that in the ideal case operational amplifiers have zero DC offset and should not require DC offset adjustment, however, in the practical case such adjustments may be desirable and can be made through means such as $R_8$.

It will be appreciated that the overall response of the herein described amplifier system will be substantially flat over a relatively wide range extending from a lower frequency close to DC up to a high frequency determined by the characteristic of the cascade amplifier stages Detail "B" and, more particularly, by the $R_1$ and $C_1$ components thereof. In a typical embodiment, the $R_1$ may be a value of 35,000 ohms and $C_1$ may be a value of $100 \times 10^{-12}$ farads (100 picofarad) which will provide a high frequency roll-off at about 40,000 cycles per second. The low frequency response of the amplifier system may be flat above about three-tenths of a cycle/second in a typical embodiment. The low frequency response will be inverse to the roll-off characteristic of the Detail "0" filter as illustrated in FIG. 12.

The circuit portion designated Detail "E" is shown within the dashed box of FIG. 7 wherein there is provided a Low Leakage Switch Element comprising a solid state analog switch having a very high "off" resistance, e.g., low leakage, preferably of the order of 10 to the 10th power ohms and a low "on" resistance of the order of between 30 and 3,000 ohms. The solid state analog switch element may advantageously be of the field effect transistor type, commonly designated FET type. A driver circuit is used to maintain a normally "off" switch in the "off" position. Such a driver circuit is shown diagrammatically as a Switch Driver Stage having its output coupled to the control input of the solid state switch (FET) and having an input, designated "S" input (Control input), for receiving digital timing pulses from such as $S_1$, $S_2$, $S_3$, $S_4$ and $S_5$ from the Digital Control Network J or J', as the case may be. As discussed above, in the operation of the disclosed amplifier systems, such as those illustrated in FIGS. 1a, 1b, 2a and 2b and in other figures hereof, the Switch Driver Stage is used to control the normally "off" solid state analog switch element (FET) comprising Detail "E" and this driver signal is derived from the timing logic circuitry so that at the proper time it will turn "ON" the analog switch element (FET) and hold it on for a given time interval. When the switch is thus turned "ON," the analog signal applied to its signal input is connected to the output thereof for the given time interval in order to pass the analog signal in accordance with the desired operating program.

The circuit elements described herein as Detail "F" are shown within the dashed box of FIG. 8 as comprising an Impedance Transformer having unity gain and being of non-inverting characteristic. For example, a suitable impedance transformer is shown in the article: "A Potpourri of FET Applications," appearing in "EDN" (Electrical Design News), March 1965, pages 38–45. (See especially: "Unity Gain Isolation Amplifier," shown on page 45). See also "Handbook of Operational Amplifier Applications," page 47, Burr-Brown Research Corporation, 1963. The Impedance Transformer comprising Detail "F" is characterized by an extremely high input impedance, preferably of the order of 10 to the 10th power ohms, and a very low output impedance, preferably of the order of 1 ohm. The very high impedance permits the use of a relatively inexpensive field effect transistor (FET) switch having a larger "on" resistance in the preceding Detail "E" switching network having its respective output coupled to the input of the Detail "F" circuit. The input impedance of the Detail "F" circuit should be equal to or greater than 10 to the 7th power times the "ON" resistance of the field effect transistor (FET), such that the "ON" resistance will not affect the measured precision or accuracy.

While the systems shown in FIGS. 1a, 1b, 2a and 2b include amplifier channels comprising five cascaded amplifier stages, it is to be understood that a different number of such stages may be employed in accordance with the invention. The number of cascaded stages depends upon the gain per stage and the total gain required to amplify the input circuit noise level, just below usable value acceptable to the analog-to-digital converter coupled to the common output. It is convenient to use stage gains expressed in powers of two, to be recorded in the binary digit form or system. Thus, with reference to FIG. 9, seven stages of "gain of eight" gives a total channel gain of 2,097,152. It would require 21 stages of "gain of two" to give the same total gain. Ten stages of "gain of four" would give a total gain of 1,048,576. An additional stage of "gain of two" would give the same total gain as before.

In a preferred embodiment wherein the A-D Converter is of the binary digit type it is possible to choose some base comparable to the decimal decade, such as base 8 which is equal to three bits in the binary system. It is to be understood that the base 2 could be used but this would increase the complexity of channels considerably for reasons that will be explained further. In a typical seismic signal processing system the seismic geophone range of signals may vary from 1 volt to 0.1 microvolt in the total usable range, i.e., over a 140 DB range. Using gain of 8 range changes, this can be covered in eight amplification steps. Gain of 2 range changes would require 21 steps of amplification, thus increasing the complexity of channels. A desirable compromise, from the economic standpoint, is to choose the gain of 8 changes. If a 15 binary bit A-D Converter is used, the most significant bit normally is used for the sign digit giving a bi-polar input capability while the other 14 bits express the absolute value of the magnitude of the measured voltage. As can be seen by the reference to FIG. 9, each time the input, expressed by the abscissa, drops below full scale by a factor of 8 the converter (voltage on the ordinate) reduces from 14 to 11 bits and the amplifier gain must be increased by 8 automatically to drive the converter input back up to 14 bits of measured accuracy. The gain of the amplifier for each stage output is shown at the top of FIG. 9, along with the stage number or exponent value. The amplifier output or A-D Converter input is shown on the right in FIG. 9, along with the significant number of bits, while the DB variation below full scale is shown on the left side of FIG. 9. The input voltage range and its DB variations below full scale are shown at the bottom of the same figure.

The gain factor is read, e.g., recorded, as an exponent of a suitable base, the resultant to be multiplied times the mantissa as read by the A-D Converter giving the desired measure of the input signal. Thus, the accuracy of such a system is equal to or greater than 11 bits or one part in a thousand, throughout a 144 db input range for eight cascaded stages and throughout 90 db input range for five cascaded stages as shown in FIGS. 1*a*, 1*b*, 2*a* and 2*b*. Reducing the Converter range below 11 bit accuracy results in a possible 210 db total dynamic range of magnitude variation. This increases to 216 db if the sign digit is considered. Note, as mentioned above, the voltage read, e.g., the recorded output signal of the system, is an accurate measure of the voltage at the geophone terminals. In a practical embodiment, below an input signal of one-fourth microvolt the measurement is essentially the noise level of the amplifier input, measured accurately.

In the operation of the disclosed amplifier system large input signals are soon amplified to a level which would block or paralyze the input of all succeeding stages. Recovery time constants in the amplifier stages would preclude measurement of lower level signals immediately following a large input signal. However, if one deliberately clips off all input amplitudes greater than full scale output divided by the gain of the stage so that the output remains in the linear operating range of the amplifier stage one can keep an amplifier channel of $n$ stages operating in a linear region. This can be done by allowing all limiting to occur in devices known to have very fast recovery times. In this manner the gain in the forward path is not changed and no gain steps occur introducing transient distortions.

The outputs of a cascaded set of amplifier stages with amplitude limited inputs will thus be limited to fit the A-D Converter range such that the maximum linear output of any path is slightly greater than full scale input for the A-D Converter. By staying in the range of one-eighth full scale (for gain-of-8 per cascaded stage system) to full scale for the outputs, and by switching the A-D converter to the output of the appropriate amplifier stage, one can stay within three binary bits (18DB) of the A-D Converter full scale value at all times and be measuring a portion of the input voltage accurately from one zero crossing point to the next of the input signal. The only requirement is to be able to switch the cascaded precision gain stage outputs automatically and at high speeds. No memory is required of previous sample amplitudes as in binary gain amplifier systems. Here each selected amplitude is completely independent of all previous ones. This is equivalent to having a 36 binary bit A-D Converter sampling the geophone voltage instantaneously and digitizing it with a guaranteed 11 bit accuracy at all times. Since the recorded geophone voltage is written in a floating point number form which is ideal for introduction into digital computers for processing, this amplifier system is referred to as the floating point amplifier system.

It will be appreciated that the above-disclosed signal processing system provides means for converting an analog signal to digital words suitable for recording in a format wherein each digital word occupies a number of binary bit positions on a magnetically recorded medium, such as a magnetic tape. As mentioned above, each such digital word is recorded in a floating point form. By thus recording the signal information in floating point form, or notation, the user of this system is able to achieve greater flexibility of operation and easier handling of signals differing greatly in magnitude, while nevertheless being able to achieve a high order of accuracy. (By way of reference, see, for example, the textbook "Digital Computer Primer" by E. M McCormick, 1959, published by McGraw-Hill Book Co., Inc. beginning at page 152).

In the illustrated embodiment, the floating point digital number thus recorded on magnetic tape represents the instantaneous absolute seismic voltage amplitude as it enters the floating point amplifier system from the geophone coupled to its input.

The floating point digital word consists of a mantissa and an exponent and is in the form:

$$Q = \pm x\, b^{-k} \qquad \text{(Eq. 1)}$$

; wherein $Q$ represents the absolute magnitude of the amplitude of the input signal to a signal channel comprising a plurality of cascaded amplifiers, as described above in a preferred embodiment where each of the cascaded stages has a gain of $b$; where $x$, the mantissa, represents the output amplitude of a particular one of the cascaded amplifier stages selected by the signal sampling portion of the system, as described above; and where $k$, the exponent, represents the net number of cascaded gain of $b$ stages through which the particular input signal is translated in order to arrive at the selected output path, as determined by the sampling circuit.

In the preferred embodiment each cascaded amplifier stage has a gain of 8; hence by substitution, Equation 1 becomes:

$$Q = \pm x\, 8^{-k} \qquad \text{(Eq. 2)}$$

In order to record the floating point digital word of Equation 2, above, in a binary register with, for example, 14 bit accuracy, 18 bit positions would be required, where the mantissa $x$ is represented in binary form, i.e., where the radix or base, of such a number system is 2, and where the exponent $k$ is represented in binary form based on the radix, or base 8. Of the 18 bits required, one bit represents the sign, allowing for bipolar input-output capabilities; 14 bits represent the mantissa $x$; and three bits represent the exponent, $k$.

It will be appreciated that the amplifier systems herein disclosed do not utilize time average sampling. Instead, they operate in a manner involving substantially instantaneous time sequential sampling and gating of the signal appearing at the respective outputs of the successive cascaded amplifier stages so that the value of the exponent $k$ as recorded in the floating point digital word is independently derived for each signal sample and thus for each recorded word, i.e., the recorded value of the exponent $k$ is independent of the exponent value of preceding or subsequent recorded words.

Advantageously, the amplifier system herein disclosed operates so as to provide substantially instaneous time sequential sampling, without time averaging, in a manner involving changes of gain range within a cycle of the signal being translated by the amplifier. Thus, the amplifier is characterized by an operating cycle which includes selecting the optimum gain range of the amplifying system or network and holding the selected gain range while the translated signal is coupled to the amplifier output for conversion to a corresponding digital signal by the analog-to-digital converter and wherein the selected gain range is maintained or held for a holding time interval which is at least sufficiently long to enable the analog-to-digital converter to make the conversion to digital form. The operating cycle including the selection of the optimum gain range and the holding time interval for the selected gain range should be completed within a signal cycle of a given input signal applied to the amplifier system and translated therethrough for conversion to a corresponding digital signal which can be recorded on magnetic tape, for example.

It is to be understood that the holding time interval for the selected gain range as determined by the comparator should be sufficiently long to enable the analog to digital converter to make the appropriate conversion to digital form, but this does not necessarily require, and for the most part will not require, that said holding time interval will be continued during the entire period required for the A-D Converter to complete such a conversion. It is to be appreciated that the typical analog-to-digital converter apparatus includes appropriate sample and hold circuitry which samples and holds an analog signal to be converted to digital form, e.g., by appropriate internal short term memory apparatus e.g., signal transfer apparatus or circuitry, which enables the A-D Converter to convert an analog signal to digital form without necessarily holding or observing the particular analog signal during the entire time that the AD conversion is taking place. Thus, the predetermined holding time for the selected gain range required by the converter to carry out its sample and hold function in the course of making the conversion does not necessarily include the entire time required for the analog-to-digital converter to complete the actual analog to digital conversion.

In a typical 5 gain range per channel embodiment of the herein described amplifier system, the system channel analog sample rate is at 1 millisecond intervals for a 32 channel system. With such a sample rate the multiplexer samples the 32 channels at a 32 kilocycle rate, providing a 31.25 microsecond sampling period for each channel. The comparator utilizes 10 microseconds to determine the gain of one seismic channel, then feeds the signal to the analog to digital converter sample and hold circuit for 5 microseconds. This is a total of 15 microseconds out of the available 31.25 microsecond period available for each channel. Otherwise state, the 10 microseconds are used to scan through and sample the various amplifier network paths within a channel and 5 microseconds are employed to feed the signal over the selected path to the AD converter sample and hold circuit. In the illustrated embodiment, during each operating cycle the sampling progresses through the amplifier network paths, as determined by the switching networks $E_1$ through $E_5$, for total of 10 microseconds for the five paths, providing five possible sampling intervals of 2 microseconds duration each. At the end of each such sampling interval the system either progresses to the next amplifier path for the next sampling interval or, if the proper signal comparison is obtained, it holds for the remainder of the unused portion of the sampling period plus the 5 microsecond holding period while the AD converter translates the signal fed to it over the selected path. In summary, each sampling interval of 2 microseconds may be followed by one or more such sampling intervals until the predetermined signal comparison with the reference is obtained, following which a holding period of 5 microseconds is provided while the signal is translated to the AD converter over the selected path. In the illustrated embodiment the holding period may also include any unused portion of the sampling period following the 2 microsecond sampling interval of the selected path. Thus, for a 5 gain range per channel embodiment, the holding period may range from 5 to 13 microseconds, depending upon whether the fifth or the first gain range signal path is selected, as determined by comparison with the predetermined reference.

In order to provide an amplifier system, as herein disclosed, wherein the recorded floating point word is an accurate representation of the absolute value of the input signal $Q$, it is desirable that all cascaded gain stages, including input gain stage A and subsequent stages $B_1$ through $B_4$, have a common amplification base $b$ such that the exponents of each gain stage are algebraically additive to form the recorded value of exponent $k$. Thus, in the illustrated embodiment, the algebraic sums of the exponents for stage A plus any of the subsequent cascaded stages $B_1$–$B_4$, through the selected one of the switching networks $E_1$ through $E_5$ to the common output, should equal the recorded value of the exponent $k$ for that particular signal.

Since amplifier systems constructed in accordance with the present invention are capable of providing an output signal indicative of the absolute value of the input signal, and which is in floating point form, there is offered a greater flexibility in utilizing and recording the output signal.

Some of the advantages in recording seismic signals, in digital form are described in further detail in an article entitled "Tools For Tomorrow's Geophysics" by Milton B. Dobrin and Stanley H. Ward, published in the journal "Geophysical Prospecting," Vol. X, pages 433–452 (1962).

With reference to the use of operational amplifiers in the above described data processing system reference is made to the "Handbook of Operational Amplifier Applications" published by Burr-Brown Research Corp., P.O. Box 11400, Tucson, Arizona, 85706, copyright 1963.

I claim:

1. A wide dynamic range automatic high speed gain ranging amplifier system comprising a plurality of DC amplifier stages each having a respective input circuit and a respective output circuit, said amplifier stages being DC coupled in cascade circuit relationship whereby the respective output circuit of each successive amplifier stage is DC coupled to the respective input circuit of the next-following amplifier stage of the cascade circuit, means defining a feedback path including an active filter having a gain of at least unity coupled between the output of the last of said successive cascaded amplifier stages and the input of the first of said stages, selectively timed switching means for alternately interrupting the input signal path to the input of the first of said cascaded stages and the feedback path including said active filter in substantially mutually out-of-phase relationship, a common output circuit, means defining a comparator circuit for comparing a signal coupled to an input circuit thereof with a predetermined reference signal, sampling means for momentarily coupling the respective outputs of said amplifier stages to said comparator circuit during respective sampling intervals occurring in time sequence, means responsive to said comparator circuit for selectively maintaining one of said amplifier stage output circuits coupled to said common output circuit for at least a predetermined minimum holding time interval when the output signal sampled at said one of said amplifier stage output circuits bears a predetermined relationship to said reference signal.

2. Apparatus as defined in claim 1 further comprising analog-to-digital converter means coupled to said common output for converting an analog signal appearing at said common output during said holding time to a digital signal of corresponding value, and means for indicating which one of said amplifier stage output circuits is coupled to said common output circuit in correlation with the value of said digital signal.

3. A wide dynamic range automatic high speed gain ranging amplifier system comprising a plurality of DC amplifier stages each having a respective input circuit and a respective output circuit, said amplifier stages being DC coupled in cascade circuit relationship whereby the respective output circuit of each successive amplifier stage is DC coupled to the respective input circuit of the next-following amplifier stage of the cascade circuit, means defining a feedback path including an active filter having a gain of at least unity coupled between the output of the last of said successive cascaded amplifier stages and the input of the first of said stages, selectively timed switching means for alternately interrupting the input signal path to the input of the first of said cascaded stages and the feedback path including said active filter in substantially mutually out-of-phase relationship, a common output circuit, means including a plurality of normally open switch means for selectively coupling the respective outputs of said amplifier stages to said common output circuit, means defining a comparator circuit coupled to said common output circuit for comparing a signal appearing at said common output circuit with a predetermined reference signal, sequencing means for momentarily closing said switch means in time sequence for sequentially coupling the respective outputs of said amplifier stages to said comparator circuit and means responsive to said comparator circuit for selectively maintaining one of said switch means in its closed position when the output signal coupled through said one switch means to said common output circuit bears a predetermined relationship to said reference signal.

4. Apparatus as defined in claim 3 further comprising high speed amplifier and impedance matching means coupled in circuit between said normally open switching means and the means defining said common output circuit.

5. A wide dynamic range automatic high speed gain ranging amplifier system comprising a plurality of DC amplifier stages each having a respective input circuit and a respective output circuit, said amplifier stages being DC coupled in cascade circuit relationship whereby the respective output circuit of each successive amplifier stage is DC coupled to the respective input circuit of the next-following amplifier stage of the cascade circuit, means defining a feedback path including an active filter having a gain of at least unity coupled between the output of the last of said successive cascaded amplifier stages and the input of the first of said stages, selectively timed switching means for alternately interrupting the input signal path to the input of the first of said cascaded stages and the feedback path including said active filter in substantial mutually out-of-phase relationship, a common output circuit, means defining a comparator circuit for comparing a signal coupled to an input circuit thereof with a predetermined reference signal, sampling means for momentarily coupling the respective outputs of said amplifier stages to said comparator circuit in timed sequence, means responsive to said comparator circuit for selectively maintaining one of said amplifier stage output circuits coupled to said common system output circuit when the output signal sampled at said one of said amplifier stage output circuits bears a predetermined relationship to said reference signal.

6. A wide dynamic range automatic high speed gain ranging amplifier system comprising a plurality of DC amplifier stages each having a respective input circuit and a respective output circuit, said amplifier stages being DC coupled in cascade circuit relationship whereby the respective output circuit of each successive amplifier stage is DC coupled to the respective input circuit of the next-following amplifier stage of the cascade circuit, means defining a feedback path including an active filter having a gain of at least unity coupled between the output of the last of said successive cascaded amplifier stages and the input of the first of said stages, selectively timed switching means for alternately interrupting the input signal path to the input of the first of said cascaded stages and the feedback path including said active filter in substantially mutually out-of-phase relationship, a common output circuit, means defining a comparator circuit for comparing a signal coupled to an input circuit thereof with a predetermined reference signal, sampling means for momentarily coupling the respective outputs of said amplifier stages to said comparator circuit in timed sequence, means responsive to said comparator circuit for selectively maintaining one of said amplifier stage output circuits coupled to said common output circuit when the output signal sampled at said one of said amplifier stage output circuits bears a predetermined relationship to said reference signal, analog-to-digital converter means coupled to said common output for converting an analog signal appearing at said output to a digital signal of corresponding value, and means for indicating which one of said amplifier stage output circuits is coupled to said common output circuit in correlation with the value of said digital signal.

7. A seismic signal processing system comprising a plurality of signal channels, each of said channels comprising a wide dynamic range automatic high speed gain ranging amplifier system including a plurality of DC amplifier stages each having a respective input circuit and a respective output circuit, said amplifier stages being DC coupled in cascade circuit relationship whereby the respective output circuit of each successive amplifier stage of the channel is DC coupled to the respective input circuit of the next-following amplifier stage of the cascade circuit, means defining a feedback path including an active filter having a gain of at least unity coupled between the output of the last of said successive cascaded amplifier stages and the input of the first of said stages, selectively timed switching means for alternately interrupting the input signal path to the input of the first of said cascaded stages and the feedback path including said active filter in substantially mutually out-of-phase relationship, a common output circuit for said seismic system, means defining a comparator circuit for comparing a signal coupled to an input circuit thereof with a predetermined reference signal, sampling means for momentarily coupling the respective outputs of the cascaded amplifier stages of each of said channels to said common output circuit in timed sequence, means responsive to said comparator circuit for selectively maintaining one of said amplifier stage output circuits coupled to said common output circuit for at least a predetermined time interval when the output signal sampled at said one of said amplifier stage output circuits bears a predetermined relationship to said reference signal, analog-to-digital converter means coupled to said common output for converting an analog signal appearing at said common output to a first digital signal of corresponding value, said converter being characterized by the capability of converting to digital form an analog signal applied thereto for said predetermined time interval, means for providing a second digital signal indicating which one of said amplifier stage output circuits is coupled to said common output circuit at least during times when one of said amplifier stage outputs is maintained coupled to said common output circuit, and means for recording signal information corresponding to said first digital signal in correlation with signal information corresponding to said second digital signal.

8. Apparatus as defined in claim 7 wherein the means for momentarily coupling the respective outputs of said amplifier stages to said comparator circuits in timed sequence comprises a digital control and multiplexer network coupled to the means for selectively maintaining one of said amplifier stage output circuits coupled to said common output circuit.

9. Apparatus as defined in claim 7 wherein said sampling means for momentarily coupling said outputs of said amplifier stages to said amplifier circuits in timed sequence comprises a digital control network coupled to the means responsive to said comparator circuit for selectively maintaining one of said amplifier stage output circuits coupled to said common output circuit and a channel multiplexer for selectively coupling the respective outputs of said channels to the common output circuit in timed sequence.

10. A signal processing system comprising a wide dynamic range automatic high speed gain ranging amplifier system including a plurality of DC amplifier stages each having a respective input circuit and a respective output circuit, said amplifier stages being DC coupled in cascade circuit relationship whereby the respective output circuit of each successive amplifier stage of the cascade circuit is DC coupled to the respective input circuit of the next-following amplifier stage of the cascade circuit, means defining a feedback path including an active filter having a gain of at least unity coupled between the output of the last of said successive cascaded amplifier stages and the input of the first of said stages, selectively timed switching means for alternately interrupting the input signal path to the input of the first of said cascaded stages and the feedback path including said active filter in substantially mutually out-of-phase relationship, a common output circuit, means defining a comparator circuit for comparing a signal coupled to an input circuit thereof with a predetermined reference signal, sampling means for momentarily coupling the respective outputs of the cascaded amplifier stages to said common output circuit in timed sequence, means responsive to said comparator circuit for selectively maintaining one of said amplifier stage output circuits coupled to said common output circuit for at least a predetermined time interval when the output signal sampled at said one of said amplifier stage output circuits bears a predetermined relationship to said reference signal, analog-to-digital converter means coupled to said common output for converting an analog signal appearing at said common output to a first digital signal of corresponding value, said converter being characterized by the capability of converting to digital form an analog signal applied thereto for said predetermined time interval, means for providing a second digital signal indicating which one of said amplifier stage output circuits is coupled to said common output circuit at least during times when one of said amplifier stage outputs is maintained coupled to said common output circuit, and means for recording signal information corresponding to said first digital signal in correlation with signal information corresponding to said second digital signal.

11. A wide dynamic range automatic high speed gain ranging amplifier system comprising an amplifier network including a plurality of DC amplifier stages each having a respective input circuit and a respective output circuit, said amplifier stages being DC coupled in cascade circuit relationship whereby the respective output circuit of each successive amplifier stage is DC coupled to the respective input circuit of the next-following amplifier stage of the cascade circuit, means defining a feedback path including an active filter having a gain of at least unity coupled between the output of the last of said successive cascaded amplifier stages and the input of the first of said stages, selectively timed switching means for alternately interrupting the input signal path to the input of the first of said cascaded stages and the feedback path including said active filter in substantially mutually out-of-phase relationship, a common output circuit for said network, means for establishing a plurality of progressively different predetermined amplifier gain ranges for said amplifier network, means for time-sequentially sampling a signal translated through said network to said common output under said progressively different gain ranges, said sampling means including means for switching progressively from one of said amplifier gain ranges to another of said ranges, means defining a comparator circuit having an input coupled to said common output for comparing a signal sampled at said common output circuit with a predetermined reference signal, means responsive to said comparator circuit for selectively maintaining one of said predetermined amplifier gain ranges for at least a predetermined minimum holding time interval when the output signal sampled at said common output bears a predetermined relationship to said reference signal.

12. Apparatus as defined in claim 11 wherein the means for establishing said plurality of progressively different predetermined amplifier gain ranges includes a plurality of switching means DC coupled in circuit with successive amplifier stages of said cascade circuit.

13. Apparatus as defined in claim 11 wherein said means for establishing said plurality of progressively different amplifier gain ranges comprises switching means for selectively deriving an output signal amplified by a progressively different number of said cascade amplifier stages.

14. Apparatus as defined in claim 10 wherein said first and second digital signals are in the form of a floating point digital word comprising a mantissa and an exponent in the form:

$Q = \pm x\, b^{-k}$ wherein $Q$ represents the magnitude of the amplitude of the input signal to said signal processing system; wherein $b$ represents the gain of each one of the cascaded amplifier stages; wherein $x$, the mantissa, represents the first digital signal which corresponds to the output amplitude of a particular one of the cascaded amplifier stages selected by the signal sampling means; wherein $k$, the exponent, represents the second digital signal which corresponds to the number of said cascaded amplifier stages through which the particular input signal is translated in order to arrive at the selected cascade amplifier stage output determined by the sampling means.

15. Apparatus as defined in claim 14 wherein said cascaded amplifier stages have a common amplification base $b$ such that the exponents of each such cascaded stage are algebraically additive to form the value of said exponent corresponding to said second digital signal.

16. Apparatus as defined in claim 1 wherein each of said plurality of cascaded amplifier stages have substantially the same DC gain and AC gain, which is significantly greater than unity.

17. Apparatus as defined in claim 16 wherein both the AC gain and DC gain of each of said cascaded amplifier stages is significantly greater than unity and wherein the overall DC gain of the network including said plurality of cascaded stages together with said feedback path is substantially the same as the AC gain thereof.

18. Apparatus as defined in claim 10 wherein each of said plurality of cascaded amplifier stages have substantially the same DC gain and AC gain, which is significantly greater than unity.

19. Apparatus as defined in claim 18 wherein the overall AC gain of the network including said plurality of cascaded stages and said feedback path is significantly greater than unity and the overall DC gain of said network is substantially the same as the AC gain thereof within a predetermined low frequency pass band down to DC.

20. Apparatus as defined in claim 11 wherein the active filter of said feedback path has a predetermined high frequency roll-off characteristic and the network comprising said plurality of cascaded amplifier stages together with said feedback path has an overall gain for both DC and AC which is significantly greater than unity.

21. Apparatus as defined in claim 20 wherein both the AC gain and the DC gain of each of said cascaded amplifier stages is significantly greater than unity and wherein the overall DC gain of the network including said plurality of cascaded stages together with said feedback is substantially the same as the AC gain thereof.

22. Apparatus as defined in claim 10 characterized by an operating cycle which is completed within the signal cycle of an amplifier system input signal of predetermined frequency, said operating cycle including the functioning of the means for momentarily coupling the respective outputs of the cascaded amplifier stages to said common output circuit and for selectively maintaining one of said amplifier stage output circuits coupled to said output for said predetermined time interval required for said analog-to-digital converter means to sample an analog signal for conversion to a first digital signal.

23. A wide dynamic range automatic high speed gain ranging amplifier system comprising an amplifier network including a plurality of DC amplifier stages each having a respective input circuit and a respective output circuit, said amplifier stages being DC coupled in cascade circuit relationship whereby the respective output circuit of each successive amplifier stage is DC coupled to the respective input circuit of the next-following amplifier stage of the cascade circuit, means defining a feedback path including an active filter having a gain of at least unity coupled between the output of the last of said successive cascaded amplifier stages and the input of the first of said stages, selectively timed switching means for alternately interrupting the input signal path to the input of the first of said cascaded stages and the feedback path including said active filter in substantially mutually out-of-phase relationship, a common output circuit for said network, means for establishing a plurality of progressively different predetermined amplifier gain ranges for said amplifier network, means for time-sequentially switching progressively from one to another of said predetermined gain ranges during successive sampling intervals, a comparator circuit adapted to compare a signal applied to an input thereof with a predetermined reference, means including said comparator circuit for comparing with said reference signals translated by said amplifier network to said common output during said sampling intervals as said amplifier network is switched progressively through said predetermined gain ranges for at least a predetermined holding time interval when the output signal sampled at said common output bears said predetermined relationship to said reference.

24. A wide dynamic range automatic high speed gain ranging amplifier system comprising an amplifier network including a plurality of DC coupled amplifier stages having both AC and DC amplification factors significantly greater than unity, each stage having a respective input circuit and a respective output circuit, a common output circuit for said network, means including a feedback loop coupling an output of said network to the input thereof together with selectively timed switching means for periodically coupling said feedback loop to said amplifier network while concurrently interrupting the application of input signals to said network for providing a net DC gain for said network that is substantially the same as the AC gain thereof, means for establishing a plurality of progressively different predetermined amplifier gain ranges for said amplifier network, means for time-sequentially switching progressively from one to another of said predetermined gain ranges during successive sampling time intervals, means comprising a comparator for comparing signals translated to said common output during said sampling intervals with a predetermined reference, means responsive to said comparator for selecting one of said gain ranges when said sampled output bears a predetermined relationship to said reference signal and for holding said predetermined gain range for at least a predetermined holding time interval while the sampled signal at said common output during said holding time interval is translated to said common output as a first signal and means for deriving a second signal indicating which one of said predetermined gain ranges is selected for a given holding time interval.

25. Apparatus as defined in claim 24 wherein said first signal is in analog form and wherein said apparatus further comprises analog-to-digital converter means coupled to said common output for converting said analog first signal to a corresponding digital first signal and wherein said predetermined holding time interval is at least as long as the characteristic minimum time required for said converter to sample said analog signal for conversion to a corresponding digital signal.

26. A wide dynamic range automatic high speed gain ranging amplifier system comprising an amplifier network including a plurality of DC coupled amplifier stages having both A.C. and DC amplification factors significantly greater than unity, each stage having a respective input circuit and a respective output circuit, a common output circuit for said network, means including a feedback loop coupling an output of said network to the input thereof together with selectively timed switching means for periodically coupling said feedback loop to said amplifier network while concurrently interrupting the application of input signals to said network for providing a net DC gain for said network that is substantially the same as the AC gain thereof, means for establishing a plurality of progressively different predetermined amplifier gain ranges for said amplifier network, means for time-sequentially switching progressively from one to another of said predetermined gain ranges during successive sampling time intervals, means responsive to signals translated to said common output during said sampling intervals for selecting one of said gain ranges when said sampled output bears a predetermined value and for holding the said selected one of predetermined gain ranges for at least a predetermined holding time interval while the sampled signal at said common output during said holding time interval is translated to said common output during said holding time interval as a first signal and means for deriving a second signal indicating which one of said predetermined gain ranges is selected for a given holding time interval.

27. Apparatus as defined in claim 26 wherein said first signal is in analog form and wherein said apparatus further comprises analog-to-digital converter means coupled to said common output for converting said analog first signal to a corresponding digital first signal and wherein said predetermined holding time interval is at least as long as the characteristic minimum time required for said converter to sample said analog signal for conversion to a corresponding digital signal.

28. Apparatus as defined in claim 27 further comprising means for recording both said digital first signal corresponding to said first analog signal and a second digital signal corresponding to said second signal in digital form as a floating point word comprising a mantissa and an exponent in the form:

$Q = \pm x\, b^{-k}$ wherein $Q$ represents the magnitude of the input signal to said amplifier system; wherein $b$ represents the gain of the individual amplifier stages of said network through which the input signal is translated to the common output; wherein $x$, the mantissa, represents the first digital signal which corresponds to said first analog signal; wherein $k$, the exponent, represents the second digital signal corresponding to said second signal indicating the selected gain range of said network during said holding time interval.

29. Apparatus as defined in claim 26 characterized by an operating cycle for said means for selecting one of said gain ranges and for holding said selected gain range during said holding time interval which is completed within the signal cycle of an amplifier system input signal of predetermined frequency.

30. Apparatus as defined in claim 19 wherein both the AC gain and DC gain of each of said plurality of cascaded stages is a whole number greater than unity.

31. Apparatus as defined in claim 14 wherein $k$ = unity and wherein $b$ = a positive integer greater than unity.

32. Apparatus as defined in claim 14 wherein the AC amplification values of $k$ = unity and of $b$ = a positive whole number greater than unity for both AC and DC amplification and wherein the net DC amplification of the plurality of said cascaded amplifier stages together with said feedback path is substantially the same as the AC gain thereof.

33. Apparatus as defined in claim 32 wherein both the AC and DC amplification value of $b=8$.

34. Apparatus as defined in claim 4 wherein said high speed amplifier and impedance matching means comprises a circuit having an input impedance which is at least of the order of $10^7$ times the "ON" resistance of the normally open switching means coupled to its input.

35. Apparatus as defined in claim 34 wherein said normally open switching means comprises a solid state analog switch having a relatively high "OFF" resistance which is at least of the order $10^{10}$ ohms and a relatively low "ON" resistance.

36. Apparatus as defined in claim 3 further comprising respective phase adjusting means coupled in at least all but the longest of the respective signal paths including each of said respective amplifier stage outputs and said common output circuit.

37. Apparatus as defined in claim 36 wherein said phase adjustment means comprises an isolation stage adapted to block switching transients between the respective switch means and the input of the next-following cascaded amplifier stage.

38. Apparatus as defined in claim 37 wherein said isolation stage further provides means for adjusting the DC level of the common output of respective switch elements in each of said paths.

39. Apparatus as defined in claim 11 wherein said means for time-sequentially sampling a signal translated through said network to said common output under progressively different gain ranges comprises means for changing the gain of said network to the common output without changing the gain of the individual stages of said network.

40. Apparatus as defined in claim 11 wherein the means for sampling a signal translated through said network to said common output functions to achieve such sampling during times that are mutually exclusive with respect to times when said means for switching progressively from one of said amplifier gain ranges to another is in the process of accomplishing such switching.

41. Apparatus as defined in claim 14 wherein $k =$ unity and wherein $b =$ a positive number.

42. A wide dynamic range automatic high speed gain ranging amplifier system comprising an amplifier network including a plurality of DC coupled DC amplifier stages each having a respective input circuit and a respective output circuit, means defining a feedback path including an active filter having a gain of at least unity coupled between an output of said network and the input of said network, selectively timed switching means for alternately interrupting the input signal path to the input of said amplifier network and the feedback path including said active filter in substantially mutually out-of-phase relationship, a common output circuit for said network, means for establishing a plurality of progressively different predetermined amplifier gain ranges comprising a plurality of different circuit paths providing said progressively different amplifier gain ranges, means for time-sequentially switching progressively from one to another of said circuit paths during successive sampling time intervals, means responsive to signals translated through said circuit paths during said sampling intervals for selecting one of said circuit paths when said sampled output bears a predetermined value and for holding the selected circuit path for at least a predetermined holding time interval while the sampled signal is translated through said selected path to said common output as a first signal and means for deriving a second signal indicating which one of said circuit paths is selected for a given holding time interval.

43. An amplifier system comprising a network including a plurality of DC amplifier stages each having a respective input circuit and a respective output circuit, said amplifier stages being DC coupled in cascade circuit relationship whereby the respective output circuit of each successive amplifier stage is coupled to the respective input circuit of the next-following amplifier stage of the cascade circuit, means for deriving output signals from successive stages of said cascade circuit, means comprising a negative feedback path coupling the output of the last of said amplifier stages to the input of the first stage of said cascade circuit, said feedback path comprising an active filter having at least unity gain and being characterized as a low pass filter and selectively timed switching means for periodically interrupting said feedback path while signals are applied to the input of the first of said cascade stages and for interrupting the application of signals to the input of said first cascade stage while said feedback path is not being thus interrupted.

44. Apparatus as defined in claim 43 wherein both the AC gain and the DC gain of each of said cascaded amplifier stages is greater than unity and substantially the same and wherein the overall DC gain of said plurality of cascaded stages together with said feedback path is substantially the same as the AC gain thereof.

45. Apparatus as defined in claim 43 wherein the active filter of said feedback path has a predetermined upper high frequency roll-off characteristic and the network comprising said plurality of cascaded amplifier stages together with said feedback path has both an overall DC gain and an overall AC gain which is significantly greater than unity.

46. Apparatus as defined in claim 1 wherein said selectively timed switching means is adapted and arranged to interrupt said input signal path and connect the input of the first of said cascaded stages to common ground during the times when said switching means interrupts the feedback path including said active filter.

47. Apparatus as defined in claim 6 wherein said selectively timed switching means is adapted and arranged to interrupt said input signal path and connect the input of the first of said cascaded stages to common ground during the times when said switching means interrupts the feedback path including said active filter.

48. Apparatus as defined in claim 7 wherein said selectively timed switching means is adapted and arranged to interrupt said input signal path and connect the input of the first of said cascaded stages to common ground during the times when said switching means interrupts the feedback path including said active filter.

49. Apparatus as defined in claim 11 wherein said selectively timed switching means is adapted and arranged to interrupt said input signal path and connect the input of the first of said cascaded stages to common ground during the times when said switching means interrupts the feedback path including said active filter.

50. Apparatus as defined in claim 23 wherein said selectively timed switching means is adapted and arranged to interrupt said input signal path and connect the input of the first of said cascaded stages to common ground during the times when said switching means interrupts the feedback path including said active filter.

51. Apparatus as defined in claim 26 wherein said selectively timed switching means is adapted and arranged to interrupt said input signal path and connect the input of the network including said stages to common ground during the times when said switching means interrupts the feedback path including said active filter.

52. Apparatus as defined in claim 42 wherein said selectively timed switching means is adapted and arranged to interrupt said amplifier network input signal path and connect the input of said amplifier network to common ground during the times when said switching means interrupts the feedback path including said active filter.

53. Apparatus as defined in claim 43 wherein said selectively timed switching means is adapted and arranged to interrupt said amplifier network input signal path and connect the input of said amplifier network to common ground during the times when said switching means interrupts the feedback path including said active filter.

54. Apparatus as defined in claim 47 wherein the selectively timed switching means is programmed to interrupt the said input signal path and connect said amplifier input to ground prior to re-connecting said feedback path to said active filter and wherein said switching means is further programmed to interrupt said feedback path prior to ungrounding said amplifier input and re-connecting the input signal path thereto.

55. Apparatus as defined in claim 48 wherein the selectively timed switching means is programmed to interrupt the said input signal path and connect said amplifier input to ground prior to re-connecting said feedback path to said active filter and wherein said switching means is further programmed to interrupt said feedback path prior to ungrounding said amplifier input and re-connecting the input signal path thereto.

56. Apparatus as defined in claim 49 wherein the selectively timed switching means is programmed to interrupt the said input signal path and connect said amplifier input to ground prior to re-connecting said feedback path to said active filter and wherein said switching means is further programmed to interrupt said feedback path prior to ungrounding said amplifier input and re-connecting the input signal path thereto.

57. Apparatus as defined in claim 50 wherein the selectively timed switching means is programmed to interrupt the said input signal path and connect said amplifier input to ground prior to re-connecting said feedback path to said active filter and wherein said switching means is further programmed to interrupt said feedback path prior to ungrounding said amplifier input and re-connecting the input signal path thereto.

58. Apparatus as defined in claim 51 wherein the selectively timed switching means is programmed to interrupt the said input signal path and connect said amplifier input to ground prior to re-connecting said feedback path to said active filter and wherein said switching means is further programmed to interrupt said feedback path prior to ungrounding said amplifier input and re-connecting the input signal path thereto.

59. Apparatus as defined in claim 52 wherein the selectively timed switching means is programmed to interrupt the said input signal path to said amplifier network and connect said amplifier network input to ground prior to re-connecting said feedback path to said active filter and wherein said switching means is further programmed to interrupt said feedback path prior to ungrounding said amplifier network input and re-connecting the input signal path thereto.

60. Apparatus as defined in claim 53 wherein the selectively timed switching means is programmed to interrupt the said input signal path to said amplifier network and connect said amplifier network input to ground prior to re-connecting said feedback path to said active filter and wherein said switching means is further programmed to interrupt said feedback path prior to ungrounding said amplifier network input and re-connecting the input signal path thereto.

61. Apparatus as defined in claim 1 wherein said feedback path including said active filter comprises signal storage means for deriving a correction signal from the last of said cascaded stages during times when said feedback path is connected in circuit while the input signal path to the first of said cascaded stages is interrupted and for inserting a drift correction signal at the input of the first of said cascaded stages during subsequent times when said feedback path is being interrupted and said input signal path to the input of said first of said cascaded stages is restored following such interruption.

62. Apparatus as defined in claim 11 wherein said feedback path including said active filter comprises signal storage means for deriving a correction signal from the last of said cascaded stages during times when said feedback path is connected in circuit while the input signal path to the first of said cascaded stages is interrupted and for inserting a drift correction signal at the input of the first of said cascaded stages during subsequent times when said feedback path is being interrupted and said input signal path to the input of said first of said cascaded stages is restored following such interruption.

63. Apparatus as defined in claim 26 wherein said feedback path including said active filter comprises signal storage means for deriving a correction signal from said output of said network during times when said feedback path is connected in circuit while said input signal path to said network is interrupted and for inserting a drift correction signal at the input of said network during subsequent times when said feedback path is being interrupted and said input signal path to the input of said network is restored following such interruption.

64. Apparatus as defined in claim 42 wherein said feedback path including said active filter comprises signal storage means for deriving a correction signal from said output of said network during times when said feedback path is connected in circuit while said input signal path to said network is interrupted and for inserting a drift correction signal at the input of said network during subsequent times when said feedback path is being interrupted and said input signal path to the input of said network is restored following such interruption.

65. A seismic signal processing system as defined in claim 7, wherein each of said amplifier channels includes an active filter having a signal output coupled to the input circuit of the amplifier system of the respective channel.

66. An apparatus as defined in claim 10, wherein said signal processing system includes an active filter having a signal processing system includes an active filter having a signal output coupled to the input of said amplifier system.

67. An amplifier system as defined in claim 23, wherein said system includes an active filter having a signal output coupled to the input of said amplifier network.

68. Apparatus as defined in claim 23, wherein said means for establishing a plurality of progressively different predetermined amplifier gain ranges for said amplifier network comprises means for changing the gain of said network to the common output by progressively switching from one to another of said amplifier stages without changing the gain of the individual stages of said network.

69. Apparatus as defined in claim 24, wherein said means for establishing a plurality of progressively different predetermined amplifier gain ranges for said amplifier network comprises means for changing the gain of said network to the common output by progressively switching from one to another of said amplifier stages without changing the gain of the individual stages of said network.

70. Apparatus as defined in claim 26, wherein said means for establishing a plurality of progressively different predetermined amplifier gain ranges for said amplifier network comprises means for changing the gain of said network to the common output by progressively switching from one to another of said amplifier stages without changing the gain of the individual stages of said network.

71. Apparatus as defined in claim 29, wherein said means for establishing a plurality of progressively different predetermined amplifier gain ranges for said amplifier network comprises means for changing the gain of said network to the common output by progressively switching from one to another of said amplifier stages without changing the gain of the individual stages of said network.

72. Apparatus as defined in claim 1, characterized in that said holding time interval is significantly longer than said sampling interval.

73. Apparatus as defined in claim 11, characterized in that said holding time interval is significantly longer than the sampling time interval.

74. Apparatus as defined in claim 23, characterized in that said holding time interval is significantly longer than said sampling time interval.

75. Apparatus as defined in claim 24, characterized in that said holding time interval is significantly longer than said sampling time interval.

76. Apparatus as defined in claim 26, characterized in that said holding time interval is significantly longer than said sampling time interval.

77. Apparatus as defined in claim 42, characterized in that said holding time interval is significantly longer than said sampling time interval.

78. A wide dynamic range automatic high speed gain ranging amplifier system comprising an amplifier network including a plurality of DC coupled amplifier stages each having a respective input circuit and a respective output circuit, said amplifier stages being coupled in cascade circuit relationship, whereby the respective output circuit of each successive amplifier stage is coupled to the respective input circuit of the next-following amplifier stage of the cascade circuit, a common output circuit for said network, means for establishing a plurality of progressively different predetermined amplifier gain ranges for said amplifier network, means operating recurrently during seccessive operating cycles of said amplifier system for time-sequentially switching during each of said operating cycles from one to another of said predetermined gain ranges during successive sampling intervals occurring in timed sequence, means for comparing a predetermined reference with signals translated by said amplifier network to said common output during said sampling intervals, means for converting an analog signal appearing at said common output to a corresponding digital signal, means for selecting one of said gain ranges when the output signal sampled at said common output bears a predetermined relationship to said reference, means for deriving a second signal indicating which one of said predetermined gain ranges has been selected during the times that said signal at said common output is converted to a corresponding digital signal, means comprising a negative feedback path coupling the output of the last of said amplifier stages to the input of the first stage of said cascade circuit, said feedback path comprising an active filter having at least unity gain and being characterized as a low pass filter, and selectively timed switching means for periodically interrupting said feedback path while signals are applied to the input of the first stage of said cascade circuit and for interrupting the application of signals to the input of said first cascade stage while said feedback path is not being thus interrupted.

79. A system as defined in claim 78, wherein said means for establishing a plurality of progressively different predetermined amplifier gain ranges for said amplifier network comprises means for sampling the respective outputs of successive ones of said amplifier stages during said successive sampling intervals.

80. A system as defined in claim 78, wherein said means for establishing a plurality of progressively difference predetermined amplifier gain ranges comprises means for selectively switching the outputs of respective amplifiers in said network to said common output.

81. A system as defined in claim 79, wherein said means for establishing a plurality of progressively different predetermined amplifier gain ranges comprises means for selecting different gain paths without changing the gain of the individual amplifier stages of said network.

82. A system as defined in claim 79, wherein the means for switching from one to another of said gain ranges during said successive sampling intervals comprises means for progressively switching during each operating cycle from a beginning gain range which is a range at one end of said plurality of ranges.

83. A wide dynamic range automatic high speed gain ranging amplifier system comprising an amplifier network including a plurality of DC coupled amplifier stages each having a respective input circuit and a respective output circuit, said amplifier stages being coupled in cascade circuit relationship, whereby the respective output circuit of each successive amplifier stage is coupled to the respective input circuit of the next-following amplifier stage of the cascade circuit, a common output circuit for said network, means for establishing a plurality of progressively different predetermined amplifier gain ranges for said amplifier network, means for switching from one to another of said predetermined gain ranges, means for comparing a predetermined reference with signals translated by said amplifier network to said common output during said sampling intervals, means for converting an analog signal appearing at said common output to a corresponding digital signal, means for selecting one of said gain ranges when the output signal sampled at said common output bears a predetermined relationship to said reference, means for deriving a second signal indicating which one of said predetermined gain ranges has been selected during the times that said signal at said common output is converted to a corresponding digital signal, means comprising a negative feedback path coupling the output of the last of said amplifier stages to the input of the first stage of said cascade circuit, said feedback path comprising a low pass filter, and selectively timed switching means for periodically interrupting said feedback path while signals are applied to the input of the first stage of said cascade circuit and for interrupting the application of signals to the input of said first cascade stage while said feedback path is not being thus interrupted.

84. Apparatus as defined in claim 83 wherein said means for switching from one to another of said predetermined gain ranges operates recurrently during successive operating cycles of said amplifier system for time sequentially switching from one to another of said predetermined gain ranges during successive sampling intervals occurring in timed sequence.

85. Apparatus as defined in claim 83 wherein said low pass filter is an active filter having at least unity gain.

86. A wide dynamic range automatic high speed gain ranging amplifier system comprising an amplifier network including a plurality of DC coupled amplifier stages each having a respective input circuit and a respective output circuit, said amplifier stages being coupled in cascade circuit relationship, whereby the respective output circuit of each successive amplifier stage is coupled to the respective input circuit of the next-following amplifier stage of the cascade circuit, a common output circuit for said network, means for establishing a plurality of progressively different predetermined amplifier gain ranges for said amplifier network, means responsive to the level of a signal applied to the input of said amplifier network for selecting one of said gain ranges for translation of said signal through said amplifier network to said common output circuit, means for converting an analog signal thus translated to said common output circuit to a corresponding digital signal, means for deriving a second signal indicating which one of said predetermined gain ranges has been selected for translation of said signal to said common output for such conversion thereof to a corresponding digital signal, means comprising a negative feedback path coupling the output of the last of said amplifier stages to the input of the first stage of said cascade circuit, said feedback path comprising a low pass filter, and selectively timed switching means for periodically interrupting said feedback path while signals are applied to the input of the first stage of said cascade circuit and for interrupting the application of signals to the input of said first cascade stage while said feedback path is not being thus interrupted.

* * * * *

PO-1050
(5/69)

UNITED STATES PATENT OFFICE
CERTIFICATE OF CORRECTION

Patent No. 3,688,250 Dated August 29, 1972

Inventor(s) DONALD L. HOWLETT

It is certified that error appears in the above-identified patent and that said Letters Patent are hereby corrected as shown below:

In line 1 of Claims 2, 4, 8, 9, 12, 13, 14, 15, 16, 17, 18, 19, 20, 21, 22, 25, 27, 28, 29, 30, 31, 32, 33, 34, 35, 36, 37, 38, 39, 40, 41, 44, 45, 46, 47, 48, 49, 50, 51, 52, 53, 54, 55, 56, 57, 58, 59, 60, 61, 62, 63, 64, 66, 68, 69, 70, 71, 72, 73, 74, 75, 76, 77, 84 and 85, the word "Apparatus" should read --A system--.

In line 2 of Claims 25 and 27, the word "apparatus" should read --system--.

Signed and sealed this 13th day of August 1974.

(SEAL)
Attest:

McCOY M. GIBSON, JR.
Attesting Officer

C. MARSHALL DANN
Commissioner of Patents